US010553630B2

(12) United States Patent
Iwasaki

(10) Patent No.: US 10,553,630 B2
(45) Date of Patent: Feb. 4, 2020

(54) IMAGE PICKUP DEVICE, IMAGE PICKUP APPARATUS, AND PRODUCTION APPARATUS AND METHOD

(71) Applicant: SONY CORPORATION, Tokyo (JP)

(72) Inventor: Masanori Iwasaki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/903,341

(22) PCT Filed: Aug. 15, 2014

(86) PCT No.: PCT/JP2014/071465
§ 371 (c)(1),
(2) Date: Jan. 7, 2016

(87) PCT Pub. No.: WO2015/029799
PCT Pub. Date: Mar. 5, 2015

(65) Prior Publication Data
US 2017/0005120 A1     Jan. 5, 2017

(30) Foreign Application Priority Data

Aug. 29, 2013 (JP) ................. 2013-177961

(51) Int. Cl.
*H01L 27/146* (2006.01)
*H01L 31/0203* (2014.01)

(52) U.S. Cl.
CPC .... *H01L 27/1462* (2013.01); *H01L 27/14621* (2013.01); *H01L 27/14632* (2013.01);
(Continued)

(58) Field of Classification Search
CPC ............. H01L 27/1462; H01L 31/0203; H01L 27/14687; H01L 27/14632;
(Continued)

(56) References Cited

U.S. PATENT DOCUMENTS

| 2009/0256225 A1* | 10/2009 | Nakai | ............... H01L 27/14623 257/432 |
| 2011/0241147 A1* | 10/2011 | Tu | ..................... H01L 27/14618 257/434 |
| 2012/0161270 A1* | 6/2012 | Maehara | ................ B82Y 10/00 257/432 |

FOREIGN PATENT DOCUMENTS

CN      101459193 A       6/2009
JP      2011-060788 A  *  5/2011

OTHER PUBLICATIONS

Office Action for CN Patent Application No. 201480046376.4, dated Apr. 18, 2018, 07 pages of Office Action and 11 pages of English Translation.

* cited by examiner

Primary Examiner — Mohammed R Alam
(74) Attorney, Agent, or Firm — Chip Law Group

(57) ABSTRACT

An image pickup device according to the present disclosure includes: a photoelectric conversion device that photoelectrically converts incident light that has entered from outside; an organic film that is formed by being laminated on a light-incident surface side of the photoelectric conversion device; and an inorganic film that is formed by being laminated on a light-incident surface and side surfaces of the organic film and seals the organic film, the side surface of the organic film being tilted by an angle at which a thickness of the inorganic film that is formed by being laminated on the side surfaces becomes a predetermined thickness. The present disclosure is applicable to an image pickup device, an image pickup apparatus, a production apparatus for image pickup device, and the like.

18 Claims, 21 Drawing Sheets

(52) U.S. Cl.
CPC .. *H01L 27/14685* (2013.01); *H01L 27/14687* (2013.01); *H01L 31/0203* (2013.01)

(58) Field of Classification Search
CPC ......... H01L 27/14685; H01L 27/14621; H01L 27/307; H01L 51/4253; H01L 51/0047; H01L 51/0059; H01L 51/001; B82Y 10/00

See application file for complete search history.

IMAGE PICKUP DEVICE, IMAGE PICKUP APPARATUS, AND PRODUCTION APPARATUS AND METHOD

TECHNICAL FIELD

The present disclosure relates to an image pickup device, an image pickup apparatus, and a production apparatus and method, more particularly, to an image pickup device, an image pickup apparatus, and a production apparatus and method with which protection performance of an organic film can be improved.

BACKGROUND ART

From the past, there has been a method of depositing, by CVD or vapor deposition, an inorganic film for preventing moisture permeation on a surface of an optical filter layer (organic film) formed of an organic material, that is provided on a photoelectric conversion device (see, for example, Patent Documents 1 and 2).

Patent Document 1: Japanese Patent Application Laid-open No. Sho 60-247202

Patent Document 2: Japanese Patent Application Laid-open No. Hei 5-283668

SUMMARY OF INVENTION

Problems to be Solved by the Invention

In the method of the related art, however, it has been difficult to deposit the inorganic film on side surfaces of the optical filter layer since the side surfaces of the optical filter layer become substantially perpendicular to the film. Therefore, the side surfaces of the optical filter layer are exposed, and thus there has been a fear that moistures and the like permeate into the optical filter layer (organic film) from that portion to cause deterioration of the optical filter layer (organic film).

For example, FIG. 2 of Patent Document 1 shows a state where a protection film is formed on side surfaces of a colored layer as an organic film, but a certain amount of thickness is required in the protection film for bearing an effect of suppressing permeation of moistures and the like. However, in actuality, there has been a fear that since it is difficult to deposit an inorganic film on vertical side surfaces as described above by CVD or vapor deposition, a protection film having a sufficient thickness cannot be formed and moistures and the like permeate into the colored layer (organic film) from that portion to cause deterioration of the colored layer (organic film).

In addition, for example, FIGS. 1 and 2 of Patent Document 2 show a state where the protection film is laminated on an interlayer film or the like as the organic film. However, since the vertical side surfaces are exposed, moistures and the like permeate into the interlayer film from the side surfaces of the interlayer film as the organic film to cause deterioration of the interlayer film.

The present disclosure has been made in view of the circumstances as described above and aims at improving protection performance of an organic film.

Means for Solving the Problems

According to an aspect of the present disclosure, there is provided an image pickup device including: a photoelectric conversion device that photoelectrically converts incident light that has entered from outside; an organic film that is formed by being laminated on a light-incident surface side of the photoelectric conversion device; and an inorganic film that is formed by being laminated on a light-incident surface and side surfaces of the organic film and seals the organic film, the side surfaces of the organic film being tilted by an angle at which a thickness of the inorganic film that is formed by being laminated on the side surfaces becomes a predetermined thickness.

The inorganic film may be a protection film that suppresses permeation of moisture or oxygen, or both of them, and the side surfaces of the organic film may be tilted by an angle at which the thickness of the inorganic film that is formed by being laminated on the side surfaces becomes a thickness with which a sufficient effect as the protection film can be obtained.

The inorganic film may be further formed by being laminated on a layer that is in contact with a surface of the organic film opposite to the light-incident surface or a layer that is formed more on the opposite side of the light-incident surface than the layer that is in contact with the surface of the organic film opposite to the light-incident surface, in a peripheral section of the organic film.

The image pickup device may further include ribs that are formed by being laminated on the light-incident surface of the inorganic film.

The image pickup device may further include a transparent layer that is formed of glass or resin and formed by being laminated on the light-incident surface of the inorganic film and the ribs.

The inorganic film may be further formed by being laminated on a surface of the organic film opposite to the light-incident surface.

The inorganic film may be formed such that a plurality of layers having different refractive indexes are structured, and the side surfaces of the organic film may be tilted by an angle at which the thickness of the inorganic film that is formed by being laminated on the side surfaces becomes a thickness that transmits a predetermined wavelength range of the incident light or a thickness that suppresses transmission of the predetermined wavelength range of the incident light.

Transmission wavelength characteristics of the inorganic film that is formed by being laminated on the light-incident surface of the organic film may differ from transmission wavelength characteristics of the inorganic film that is formed by being laminated on the side surfaces of the organic film.

The inorganic film that is formed by being laminated on the light-incident surface of the organic film may transmit a wavelength range that is photoelectrically converted by the photoelectric conversion device, and the inorganic film that is formed by being laminated on the side surfaces of the organic film may suppress transmission of the wavelength range that is photoelectrically converted by the photoelectric conversion device.

The inorganic film that is formed by being laminated on the light-incident surface of the organic film may transmit a wavelength range of visible light, and the inorganic film that is formed by being laminated on the side surfaces of the organic film may suppress transmission of the wavelength range of visible light.

The thickness of the inorganic film that is formed by being laminated on the light-incident surface of the organic film and the thickness of the inorganic film that is formed by being laminated on the side surfaces of the organic film may differ.

A ratio of the thickness of the inorganic film that is formed by being laminated on the side surfaces of the organic film to the thickness of the inorganic film that is formed by being laminated on the light-incident surface of the organic film may be equal to or smaller than a ratio of a lower limit of the wavelength range transmitted through the inorganic film that is formed by being laminated on the light-incident surface of the organic film to an upper limit of the wavelength range.

The number of layers of the inorganic film that is formed by being laminated on the light-incident surface of the organic film may differ from the number of layers of the inorganic film that is formed by being laminated on the side surfaces of the organic film.

According to another aspect of the present disclosure, there is provided an image pickup apparatus including: an image pickup device including a photoelectric conversion device that photoelectrically converts incident light that has entered from outside, an Organic film that is formed by being laminated on a light-incident surface side of the photoelectric conversion device, and an inorganic film that is formed by being laminated on a light-incident surface and side surfaces of the organic film and seals the organic film, the side surfaces of the organic film being tilted by an angle at which a thickness of the inorganic film that is formed by being laminated on the side surfaces becomes a predetermined thickness; and an image processing section that perform is image processing on pickup image data obtained by the image pickup device.

According to another aspect of the present disclosure, there is provided a production apparatus that produces an image pickup device, including: a photoelectric conversion device formation section that forms a photoelectric conversion device that photoelectrically converts incident light that enters from outside; an organic film formation section that forms an organic film by laminating it on a light-incident surface side of the photoelectric conversion device; an organic film processing section that processes the organic film formed by the organic film formation section while imparting, to side surfaces of the organic film, a tilt by an angle at which a thickness of the inorganic film that is formed by being laminated on the side surfaces becomes a predetermined thickness; and an inorganic film formation section that forms an inorganic film that seals the organic film by laminating it on a light-incident surface and side surfaces of the organic film.

The inorganic film formation section may form the inorganic film laminated on the light-incident surface of the organic film and the inorganic film laminated on the side surfaces of the organic film in the same step.

The inorganic film formation section may form the inorganic film laminated on the light-incident surface of the organic film and the inorganic film laminated on the side surfaces of the organic film in different steps.

According to another aspect of the present disclosure, there is provided a production method for a production apparatus that produces an image pickup device, including: forming a photoelectric conversion device that photoelectrically converts incident light that enters from outside; forming an organic film by laminating it on a light-incident surface side of the photoelectric conversion device; processing the formed organic film while imparting, to side surfaces of the organic film, a tilt by an angle at which a thickness of the inorganic film that is formed by being laminated on the side surfaces becomes a predetermined thickness; and forming an inorganic film that seals the organic film by laminating it on a light-incident surface and side surfaces of the organic film.

According to another aspect of the present disclosure, there is provided a production apparatus that produces an image pickup device, including: an image pickup device formation section that forms an image pickup device that photoelectrically converts incident light that enters from outside; a rib formation section that forms ribs on a transparent layer formed of glass or resin; an inorganic film formation section that forms an inorganic film by laminating it on a surface of the transparent layer on which the ribs are formed by the rib formation section; an organic film formation section that forms an organic film by laminating it on the inorganic film formed by being laminated on the transparent layer by the inorganic film formation section; and a bonding section that bonds the organic film formed by being laminated on the transparent layer by the organic film formation section and a light-incident surface of the image pickup device formed by the image pickup device formation section.

According to another aspect of the present disclosure, there is provided a production method for a production apparatus that produces an image pickup device, including: forming an image pickup device that photoelectrically converts incident light that enters from outside; forming ribs on a transparent layer formed of glass or resin; forming an inorganic film by laminating it on a surface of the transparent layer on which the ribs are formed; forming an organic film by laminating it on the inorganic film formed by being laminated on the transparent layer; and bonding the organic film formed by being laminated on the transparent layer and a light-incident surface of the formed image pickup device.

According to the aspect of the present disclosure, the image pickup device includes: the photoelectric conversion device that photoelectrically converts incident light that has entered from outside; the organic film that is formed by being laminated on the light-incident surface side of the photoelectric conversion device; and the inorganic film that is formed by being laminated on the light-incident surface and side surfaces of the organic film and seals the organic film, the side surfaces of the organic film being tilted by an angle at which a thickness of the inorganic film that is formed by being laminated on the side surfaces becomes a predetermined thickness.

According to the another aspect of the present disclosure, the image pickup apparatus includes: the image pickup device including the photoelectric conversion device that photoelectrically converts incident light that has entered from outside, the organic film that is formed by being laminated on the light-incident surface side of the photoelectric conversion device, and the inorganic film that is formed by being laminated on the light-incident surface and side surfaces of the organic film and seals the organic film, the side surfaces of the organic film being tilted by an angle at which a thickness of the inorganic film that is formed by being laminated on the side surfaces becomes a predetermined thickness; and the image processing section that performs image processing on pickup image data obtained by the image pickup device.

According to the another aspect of the present disclosure, in the production apparatus that produces an image pickup device: the photoelectric conversion device that photoelectrically converts incident light that enters from outside is formed; the organic film is formed by laminating it on the light-incident surface side of the photoelectric conversion device; the formed organic film is processed while imparting, to side surfaces of the organic film, a tilt by an angle at which a thickness of the inorganic film that is formed by being laminated on the side surfaces becomes a predetermined thickness; and the inorganic film that seals the organic film is formed by laminating it on the light-incident surface and side surfaces of the organic film.

According to the another aspect of the present disclosure, in the production apparatus that produces an image pickup device: the image pickup device that photoelectrically converts incident light that enters from outside is formed; the ribs are formed on the transparent layer formed of glass or resin; the inorganic film is framed by laminating it on the surface of the transparent layer on which the ribs are formed; the organic film is formed by laminating it on the inorganic film formed by being laminated on the transparent layer; and the organic film formed by being laminated on the transparent layer and the light-incident surface of the formed image pickup device are bonded.

Effects of the Invention

According to the present disclosure, an object can be photographed, more particularly, moisture resistance performance can be improved.

MODES FOR CARRYING OUT THE INVENTION

Hereinafter, configurations for embodying the present disclosure (hereinafter, referred to as embodiments) will be described. It should be noted that the descriptions will be made in the following order.

1. First Embodiment (Image Pickup Device)
2. Second Embodiment (Production Apparatus)
3. Third Embodiment (image Pickup Apparatus)

<1. First Embodiment>

(Concern on Moisture Resistance of Organic Film)

From the past, a layer formed of an organic material (hereinafter, also referred to as organic film) has been formed in an image pickup device in some cases. For example, an optical filter layer formed of an organic material is sometimes provided as an infrared cut filter. There has been a fear that such an, organic film is deteriorated due to permeation of moistures, oxygen, and the like when exposed to open air.

In this regard, for preventing permeation of moistures, oxygen, and the like into such an organic film, providing a layer formed of an inorganic material (hereinafter, also referred to as inorganic film) for suppressing transmission of moistures, oxygen, and the like on a surface of the organic film (between organic film and open air) has been considered. Such an inorganic film is formed by, for example, CVD (Chemical Vapor Deposition) or vapor deposition.

However, since side surfaces of the organic film become substantially vertical in the method of the past, it has been difficult to deposit the inorganic film on the side surfaces of the organic film. In the case of CVD, for example, gas including a raw material (inorganic material in this case) is energized by heat or light or plasma-enhanced at a high frequency so that the raw material becomes radical to become highly reactive and is absorbed and deposited on a substrate. Therefore, it has at least been difficult to control the thickness and significantly difficult to positively form an inorganic film having a sufficient thickness. As a result, a part or all of the side surfaces of the organic film becomes exposed (including case where thickness of inorganic film is insufficient), and thus there has been a fear that moistures, oxygen, and the like permeate into the organic film from that portion to cause deterioration of the organic film.

<Specific Example of Protection Film>

As a specific example of the inorganic film that is formed as a protection Elm for suppressing deterioration of the organic film as described above, there is the protection films as disclosed in Patent Documents 1 and 2.

Figure 2:
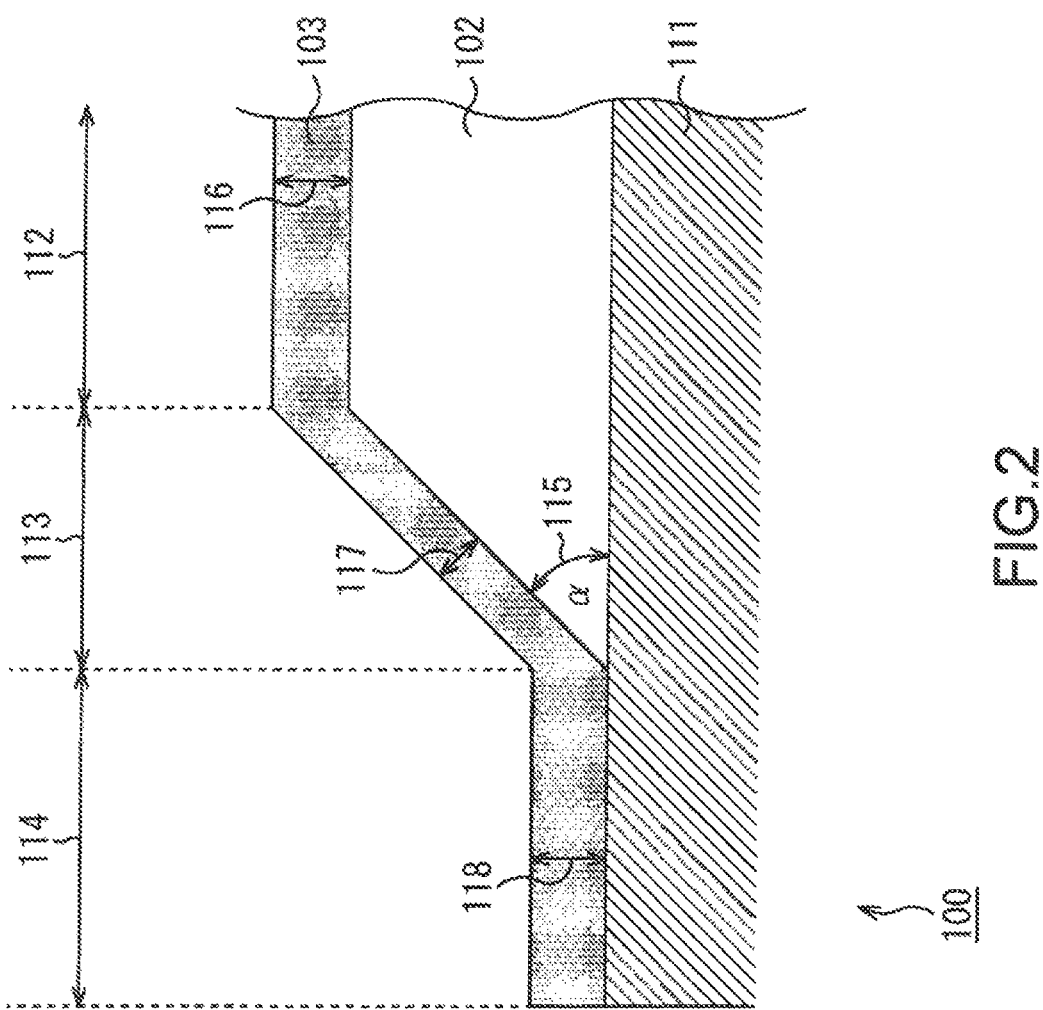
[FIG. 2] An enlarged diagram showing a part of FIG. 1.

FIG. 2 of Patent Document 1 shows a state where the protection film (inorganic film) is formed by a transparent metal-oxide film on side surfaces of a colored layer as the organic film. However, in actuality, there has been a fear that since it is difficult to deposit a protection film having a sufficient thickness on vertical side surfaces as described above, moistures, oxygen, and the like permeate into the colored layer as the organic film from that portion to cause deterioration of the colored layer.

Figure 1:
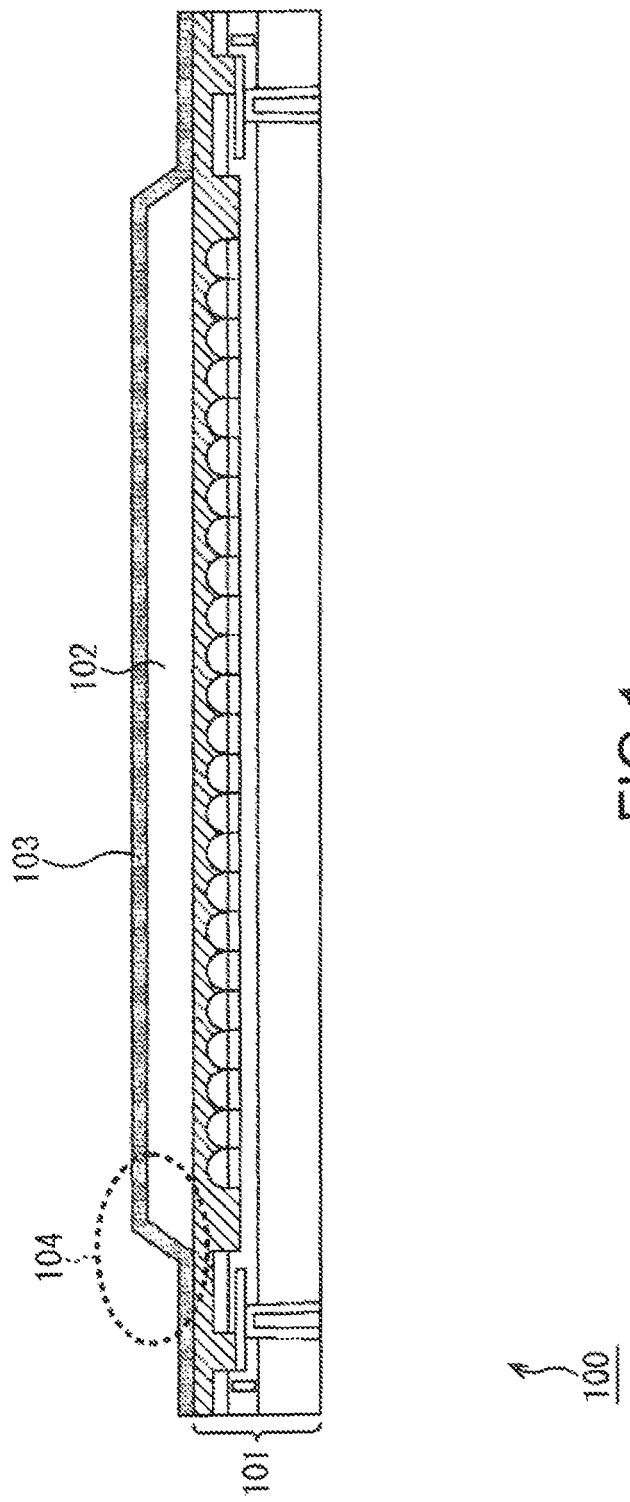
[FIG. 1] A cross-sectional diagram showing a partial structural example of an image pickup device.

In addition, for example, FIGS. 1 and 2 of Patent Document 2 show a state where the protection film (inorganic film) is laminated on an interlayer film or the like as the organic film. However, since the vertical side surfaces of the interlayer film are exposed as shown in FIGS. 1 and 2, there has been a fear that moistures, oxygen, and the like permeate into the interlayer film from the side surfaces of the interlayer film as the organic film to cause deterioration of the interlayer film.

<Tilt of Side Surfaces of Organic Film>

In this regard, the side surfaces of the organic film formed in the image pickup device are tilted by an angle at which the thickness of the inorganic film formed by being laminated on the side surfaces becomes a predetermined thickness. In addition, the inorganic film that suppresses permeation of moistures, oxygen, and the like into the organic film is formed by being laminated on a light-incident surface and side surfaces of the organic film, and thus the organic film is sealed.

With such a structure, it is possible to form, also on the side surfaces of the organic film, an inorganic film having enough thickness to sufficiently obtain the effect of suppressing permeation of moistures, oxygen, and the like into the organic film. In other words, protection performance of the organic film can be improved.

<Image Pickup Device>

FIG. 1 is a cross-sectional diagram showing a main structural example of a pixel of the image pickup device to which the present technique is applied. The organic-film-attached image pickup device 100 shown in FIG. 1 is a back-irradiation-type CMOS (Complementary Metal Oxide Semiconductor) image sensor that picks up an image of an object and acquires a pickup image as electrical signals. The organic-film-attached image pickup device 100 includes a plurality of pixels arranged in a plane such as in an array. Incident light is photoelectrically converted at each pixel, and pixel signals of a pickup image are obtained. FIG. 1 shows, as the cross-sectional diagram, an example of a laminated structure of a portion related to the light reception of the organic-film-attached image pickup device 100. In FIG. 1, for convenience of descriptions, the laminated structure is shown schematically. Also in FIG. 1, structures that are not used for describing the present technique are simplified or omitted.

Also in FIG. 2 and subsequent figures, structures necessary for describing the present technique are shown schematically as appropriate as in FIG. 1, and other structures will be simplified or omitted.

In FIG. 1, light from an object enters the organic-film-attached image pickup device 100 downwardly from above in the figure. Although shown schematically in FIG. 1, the number of pixels of the organic-film-attached image pickup device 100 is arbitrary. For example, scales of several hundred-thousand pixels, several million pixels, several ten-million pixels, and the like are assumed in general, but the number of pixels may be smaller than those or may be a single pixel.

As shown in FIG. 1, the organic-film-attached image pickup device 100 includes an image pickup device 101, an infrared cut filter 102 as an organic film formed by being laminated on a light-incident surface side of the image pickup device 101, and a moisture-resistant film 103 that seals the infrared cut filter 102.

The image pickup device 101 includes, for example, a photodiode (photoelectric conversion device that photoelectrically converts incident light), a wiring layer, a light shield film, a flattening film, a color filter, and a collective lens that are formed on a silicon substrate and is capable of picking up images of an object and obtaining pickup images.

The infrared cut filter 102 as an example of the organic film formed of an organic material is an optical filter that suppresses transmission of infrared light. In other words, the infrared cut filter 102 suppresses entering of infrared light into the image pickup device 101 (removes infrared wavelength range components from incident light of image pickup device 101).

While the photoelectric conversion device that uses silicon has sensitivity in a wavelength range equal to or larger than a spectral luminous efficiency property of human beings, unnecessary near-infrared light can be removed by providing the infrared cut filter 102 on the light-incident surface side, and thus the image pickup device 101 can obtain pickup images close to the spectral luminous efficiency property of human beings.

It should be noted that the infrared cut filter 102 may suppress transmission of all wavelength ranges of infrared light or suppress transmission of partial wavelength ranges of infrared light. Moreover, light whose transmission is suppressed by the infrared cut filter 102 is not limited to infrared light and may be light of any wavelength range. For example, a band-stop filter that suppresses transmission of visible light having a wavelength of about 650 nm to 750 nm may be used. Alternatively, for example, a bandpass filter that transmits only visible light having a wavelength of about 400 nm to 650 nm may be used.

The infrared cut filter 102 is an organic film formed of an organic material and is apt to deteriorate by moisture permeation due to low moisture resistance (apt to be optically influenced).

The moisture-resistant film 103 is an organic film that is formed of an inorganic material and formed by being laminated on a surface of the infrared cut filter 102 including at least the light-incident surface and side surfaces to seal the infrared cut filter 102. Examples of the inorganic material include silver oxide (I) ($Ag_2O$), silver monoxide (AgO), aluminum oxide ($Al_2O_3$), aluminum fluoride ($AlF_3$), barium fluoride ($BaF_2$), cerium oxide (IV) ($CeO_2$), chromium oxide (III) ($Cr_2O_3$), chromium sulfide (III) ($Cr_2S_3$), gadolinium fluoride ($GdF_3$), hafnium oxide (IV) ($HfO_2$) indium tin oxide (ITO), lanthanum fluoride ($LaF_3$), lithium niobate ($LiNbO_3$), magnesium fluoride ($MgF_2$), magnesium oxide (MgO), sodium hexafluoro aluminate ($Na_3AlF_6$), niobium pentoxide ($Nb_2O_5$), nichrome (Ni—Cr), nitride of nichrome (NiCrNx), nitrogen oxide (OxNy), silicon nitride ($SiN_4$), silicon oxide (SiO), silicon dioxide ($SiO_2$), tantalum pentoxide ($Ta_2O_5$), titanium trioxide ($Ti_2O_3$), titanium pentoxide ($Ti_3O_5$), titanium oxide (TiO), titanium dioxide ($TiO_2$), tungsten oxide ($WO_3$), yttrium oxide ($Y_2O_3$), yttrium fluoride ($YF_3$), zinc sulfide (ZnS), zirconium dioxide ($ZrO_2$), and indium oxide ($In_2O_3$), though other materials may of course be used.

The moisture-resistant film 103 is deposited in a thickness with which moisture permeation with respect to the infrared cut filter 102 can be sufficiently suppressed.

<Side Surfaces of Organic Film>

FIG. 2 is an enlarged diagram of a portion surrounded by the dotted line 104 in FIG. 1, that is, a portion in the vicinity of the side surface of the infrared cut filter 102 as the organic film.

In FIG. 2, a flattening film 111 is a structure of the image pickup device 101 and is a layer that flattens a surface of a non-flat collective lens. The flattening film 111 is a layer adjacent to a surface of the infrared cut filter 102 opposite to the light-incident surface.

Also in FIG. 2, the double-headed arrow 112 indicates a portion where the light-incident surface of the infrared cut filter 102 (upper surface in FIG. 2) is formed. Moreover, the double-headed arrow 113 indicates a portion where the side surface of the infrared cut filter 102 is formed. Further, the double-headed arrow 114 indicates a portion where the infrared cut filter 102 is not formed (peripheral portion of infrared cut filter 102).

As shown in FIG. 2, the light-incident surface of the infrared cut filter 102 (portion indicated by double-headed arrow 112) is formed substantially as a plane while being substantially parallel to the surface opposite to the light-incident surface (light-incident surface of flattening film 111). Further, the side surface of the infrared cut filter 102 (portion indicated by double-headed arrow 113) is not vertical and is tilted by a predetermined angle α with respect to the surface opposite to the light-incident surface as indicated by the double-headed arrow 115.

The angle α of the side surface of the infrared cut filter 102 is set at a level of angle at which the thickness 117 of the moisture-resistant film 103 laminated on the side surface (portion indicated by double-headed arrow 113) becomes a thickness with which moisture permeation with respect to the infrared cut filter 102 can be sufficiently suppressed. In other words, the side surface of the infrared cut filter 102 is tilted by an angle at which the thickness 117 of the moisture-resistant film 103 (inorganic film) becomes a thickness with which a sufficient effect as the protection film can be obtained (i.e., thickness with which sufficient moisture resistance can be obtained).

The angle α of the side surface may be any angle as long as it is an angle at which the thickness 117 of the moisture-resistant film 103 becomes a thickness with which a sufficient effect as the protection film can be obtained (i.e., thickness with which sufficient moisture resistance can be obtained).

For example, when the angle α of the side surface is about 90 degrees or more, there is a fear that it becomes difficult to control the thickness 117 of the moisture-resistant film 103 laminated on the side surface as described above, with the result that the thickness of the moisture-resistant film 103 cannot be made sufficient and the infrared cut filter 102 cannot obtain sufficient moisture resistance.

In this regard, the angle α of the side surface of the infrared cut filter 102 is set at an angle smaller than 90 degrees, for example. With such a structure, the moisture-resistant film 103 can be deposited such that the thickness 117 of the moisture-resistant film 103 on the side surfaces of the infrared cut filter 102 becomes a sufficient thickness with ease by methods of CVD, vapor deposition, and the like.

It should be noted that the thickness 117 of the moisture-resistant film 103 deposited by CVD, vapor deposition, and the like under the same condition differs depending on the size of the angle α. The thickness 117 of the moisture-resistant film 103 basically varies linearly according to the size of the angle α, and the thickness tends to become smaller as the angle α becomes larger and become larger as the angle α becomes smaller. In addition, an area necessary for forming the side surfaces of the infrared cut filter 102 naturally becomes smaller as the angle α becomes larger and becomes larger as the angle α becomes smaller.

Moreover, as will be described later, there are a method of depositing, using a mask, the moisture-resistant film 103 at the portion indicated by the double-headed arrow 113 and the moisture-resistant film 103 at the portions indicated by the double-headed arrows 112 and 114 in different steps and a method of depositing the moisture-resistant film 103 at the portion indicated by the double-beaded arrow 112, the portion indicated by the double-headed arrow 113, and the portion indicated by the double-headed arrow 114 all in the same step. In the case of the latter method, as the angle α of the side surface of the infrared cut filter 102 becomes smaller, the thickness 117 of the moisture-resistant film 103 on the side surface of the infrared cut filter 102 (portion indicated by double-headed arrow 113) is more approximated to the thickness 116 of the moisture-resistant film 103 on the light-incident surface of the infrared cut filter 102 (portion indicated by double-headed arrow 112) or the thickness 118 of the moisture-resistant film 103 in the peripheral portion of the infrared cut filter 102 (portion indicated by double-headed arrow 114).

Considering the tendencies as described above, the angle α can be set arbitrarily within a range in which the thickness 117 of the moisture-resistant film 103 becomes a thickness with which a sufficient effect as the protection film can be obtained (i.e., thickness with which sufficient moisture resistance can be obtained).

In other words, the moisture-resistant film 103 is deposited in a thickness with which moisture permeation with respect to the infrared cut filter 102 can be sufficiently suppressed in any of the portions indicated by the double-headed arrows 112 to 114. At this time, since the light-incident surface of the infrared cut filter 102 and the light-incident surface of the flattening film 111 in the peripheral portion of the infrared cut filter 102 are formed substantially in parallel, the thickness 116 and the thickness 118 can be made sufficient with ease. Moreover, as described above, since the side surfaces of the infrared cut filter 102 are tilted by the angle α, the thickness 117 can also be made sufficient with ease.

It should be noted that since the moisture-resistant film 103 only needs to seal the infrared cut filter 102, it only needs to be formed by being laminated on at least the light-incident surface and side surfaces of the infrared cut filter 102 (i.e., only needs to be formed at portions indicated by double-headed arrows 112 and 113). Of course, the moisture-resistant it 103 may be formed by being laminated on the flattening film 111 also in the peripheral portion of the infrared cut filter 102 (portion indicated by double-headed arrow 114) as shown in FIG. 2. With such a structure, it becomes possible to more positively suppress permeation of moistures into the infrared cut filter 102 from interlayers of the flattening film 111 and the moisture-resistant film 103.

It should be noted that as long as the tilt angle is controlled like the angle α described above, the side surfaces of the infrared cut filter 102 as the organic film may either be flat surfaces or curved surfaces.

<Transparent Layer and Ribs>

Figure 3:
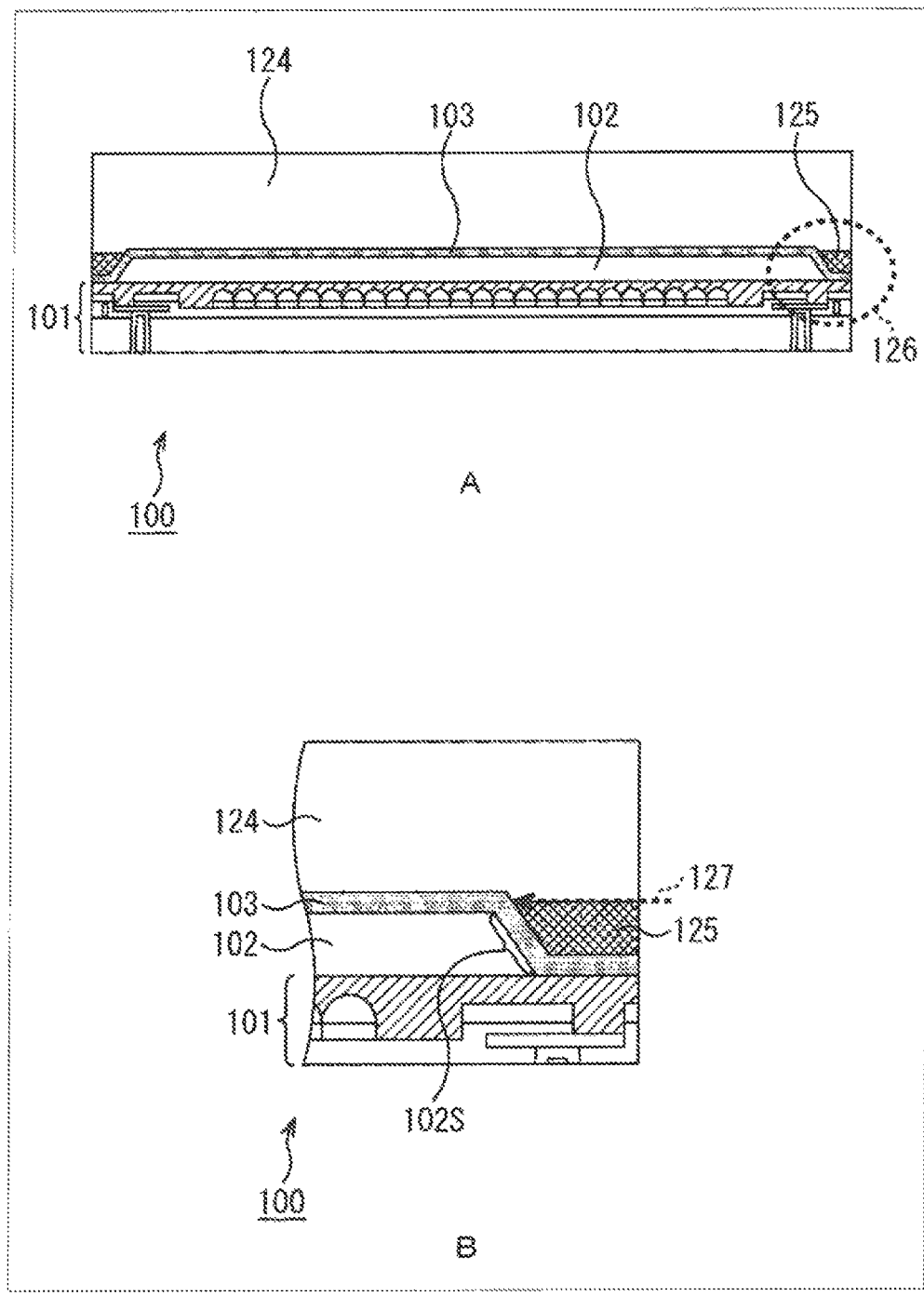
[FIG. 3] Cross-sectional diagrams showing another structural example of the image pickup device.

The organic-film-attached image pickup device 100 may further include a transparent layer 124 formed by being laminated on the light-incident surface of the moisture-resistant film 103 as shown in FIG. 3A. The transparent layer 124 is formed of glass (e.g., quartz), resin, or the like.

Further, ribs 125 may be formed between the moisture-resistant film 103 and the transparent layer 124 on the side surfaces of the infrared cut filter 102 and the peripheral portion thereof. FIG. 3B shows an enlarged diagram of a portion surrounded by a dotted line 126 of FIG. 3A.

As indicated by a dotted arrow 127 in FIG. 3B, moistures generally apt to permeate between the transparent layer 124 and the ribs 125. However, as described above, also on the side surface 102S of the infrared cut filter 102, the moisture-resistant film 103 is formed in a thickness with which sufficient moisture resistance can be obtained. Therefore, in the organic-film-attached image pickup device 100, moistures that have permeated as indicated by the dotted arrow 127 can also be suppressed from entering the infrared cut filter 102 (organic film) by the moisture-resistant film 103.

<Moisture-Resistant Film of Peripheral Section>

Figure 4:
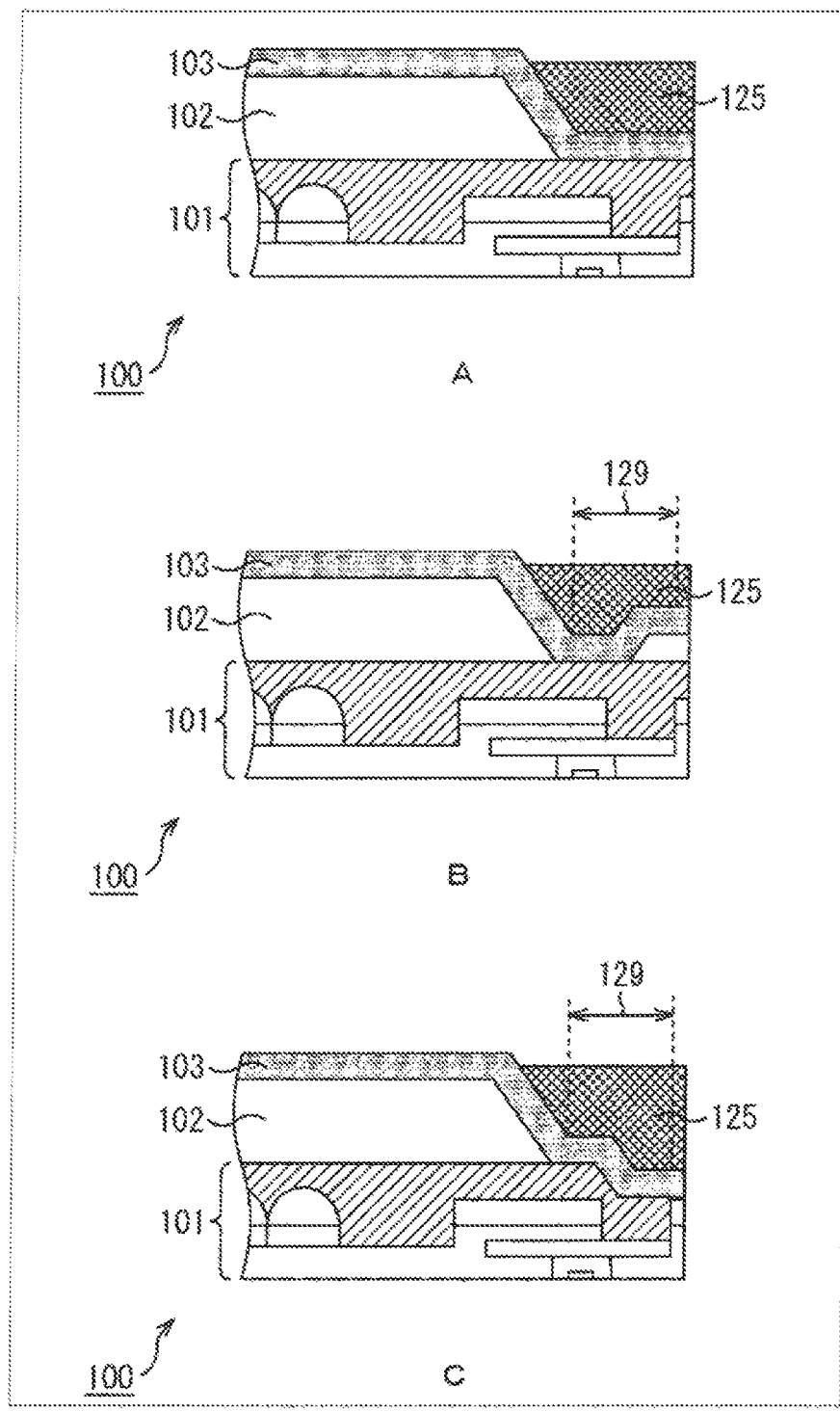
[FIG. 4] Cross-sectional diagrams showing other structural examples of the image pickup device.

It should be noted that the light-incident surface of the flattening film 111 (surface on which moisture-resistant film 103 is laminated) in the peripheral section of the infrared cut filter 102 may be a flat surface as shown in FIG. 4A or may include concavity and convex as shown in FIGS. 4B and 4C.

<Optical Property Control Based on Thickness of Side Surfaces>

Figure 5:
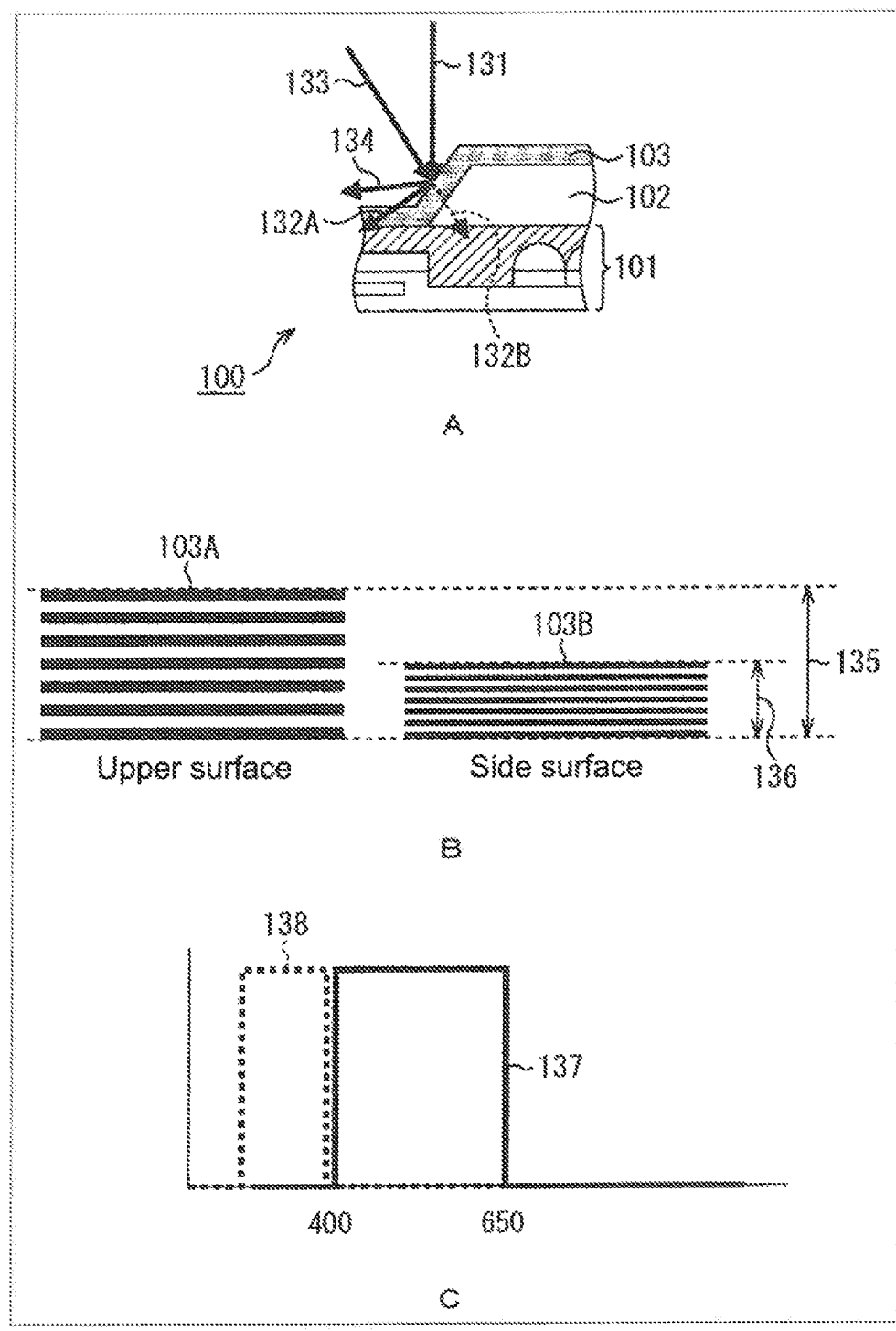
[FIG. 5] Diagrams for explaining an example of transmission wavelength characteristics.

By tilting the side surfaces of the infrared cut filter 102 by the angle α as described above, light also enters from the side surfaces as shown in FIG. 5A. However, since the angle of the side surfaces differs from that of the light-incident surface and the thicknesses of the infrared cut filter 102 also differ, light that has entered from the side surfaces and light that has entered from the light-incident surface highly likely differ in optical features. In other words, when attempting to cause light that has entered from the side surfaces to enter the photoelectric conversion device to be photoelectrically converted, there is a fear that optical features of incident light will differ between pixels that photoelectrically convert light that has entered from the side surfaces and pixels that photoelectrically convert light that has entered from the light-incident surface, to thus cause lowering of image quality of pickup images. Therefore, it is desirable for the positions of the side surfaces of the infrared cut filter 102 (organic film) to be outside an effective pixel area.

Moreover, even in such a case, while light that enters the side surfaces as indicated by the arrow 131 is partially reflected on the surface of the moisture-resistant film 103 as indicated by the arrow 132A, other part enters the infrared cut filter 102 (organic film) as indicated by the arrow 132B and reaches the image pickup device 101. This incident light reaches the photoelectric conversion device while repeating the reflection on the interlayer between the infrared cut filter 102 and the light-incident surface of the image pickup device 101 (light-incident surface of flattening film 111) and the reflection on the interlayer between the infrared cut filter 102 (organic film) and the moisture-resistant film 103 (inorganic film) and sometimes appears as noises such as ghosts and flares in pickup images.

In this regard, the moisture-resistant film 103 (inorganic film) is constituted of a plurality of layers (structure moisture-resistant film 103 as multi-layer structure) having different refractive indexes so as to transmit light of a desired wavelength range. In addition, as shown in FIG. 5B, the thickness 135 of the moisture-resistant film 103A at a portion of the light-incident surface (upper surface) of the infrared cut filter 102 and the thickness 136 of the moisture-resistant film 103B at a portion of the side surfaces of the infrared cut filter 102 are differentiated.

More specifically, the thickness 135 is set to be a thickness with which the moisture-resistant film 103A at the portion of the light-incident surface (upper surface) of the infrared cut filter 102 transmits light of a desired wavelength range (e.g., visible light), and the thickness 136 is set to be a thickness with which the moisture-resistant film 103B at the portion of the side surfaces of the infrared cut filter 102 suppresses transmission of light at that wavelength range (e.g., visible light).

When the number of layers of the moisture-resistant film 103A and that of the moisture-resistant film 103B are the same as shown in FIG. 5B, the thicknesses of the layers also differ since the thicknesses of the films differ, with the result that transmission spectral properties differ. In other words, in this case, by controlling the thickness of the moisture-resistant film 103B laminated on the side surfaces of the infrared cut filter 102 as the organic film, the wavelength range to be transmitted and the wavelength range suppressed to be transmitted (transmission spectral properties) can be controlled.

For example, it is also possible for the inorganic film formed by being laminated on the light-incident surface of the organic film to transmit a wavelength range photoelectrically converted by the photoelectric conversion device and the inorganic film formed by being laminated on the side surfaces of the organic film to suppress transmission of the wavelength range photoelectrically converted by the photoelectric conversion device. With such a structure, it is possible to suppress the influence of incident light that enters from the side surfaces of the organic film on the photoelectric conversion and suppress lowering of image quality of pickup images Obtained by the image pickup device 101.

More specifically, for example, it is also possible for the inorganic film formed by being laminated on the light-incident surface of the organic film to transmit a wavelength range of visible light and the inorganic film formed by being laminated on the side surfaces of the organic film to suppress transmission of the wavelength range of visible light.

For example, on the moisture-resistant film 103A (upper surface), a multilayer film that transmits visible light having a wavelength of 400 nm to 650 nm and removes ultraviolet light having a wavelength of 400 nm or less and near-infrared light having a wavelength of 650 nm to 1200 nm as indicated by the solid line 137 of FIG. 5C is provided. In contrast, on the moisture-resistant film 103B (side surface), a multilayer film obtained by thinning the thickness of each of the layers of the multilayer film of the moisture-resistant film 103A to about 60% is provided. Since the principle of the multilayer film is laminating layers having thicknesses that are ¼ the wavelengths having different refractive indexes and reflecting a desired wavelength band by multiple interference, the thickness of the multilayer film is proportional to the wavelength.

In other words, when the multilayer film of the moisture-resistant film 103B is thinned to about 60% the moisture-resistant film 103A, for example, a spectral transmittance property that removes at least light within a wavelength range of 390 nm to 720 nm is obtained as indicated by the dotted line 138 in FIG. 5C. Accordingly, visible light within the wavelength range of 390 nm to 720 nm that enters the moisture-resistant film 103B (side surfaces) cannot be transmitted through the infrared cut filter 102 as the organic film and is reflected on the surface of the moisture-resistant film 103 as indicated by the arrows 133 and 134 of FIG. 5A.

Therefore, the amount of visible light that enters from the side surfaces of the infrared cut filter 102 and reaches the photoelectric conversion device of the image pickup device 101 is reduced. In other words, it becomes possible to reduce ghosts and flares in pickup images obtained by the image pickup device 101, that is, lowering of image quality of pickup images can be suppressed.

<Thickness of Moisture-Resistant Film>

Figure 6:
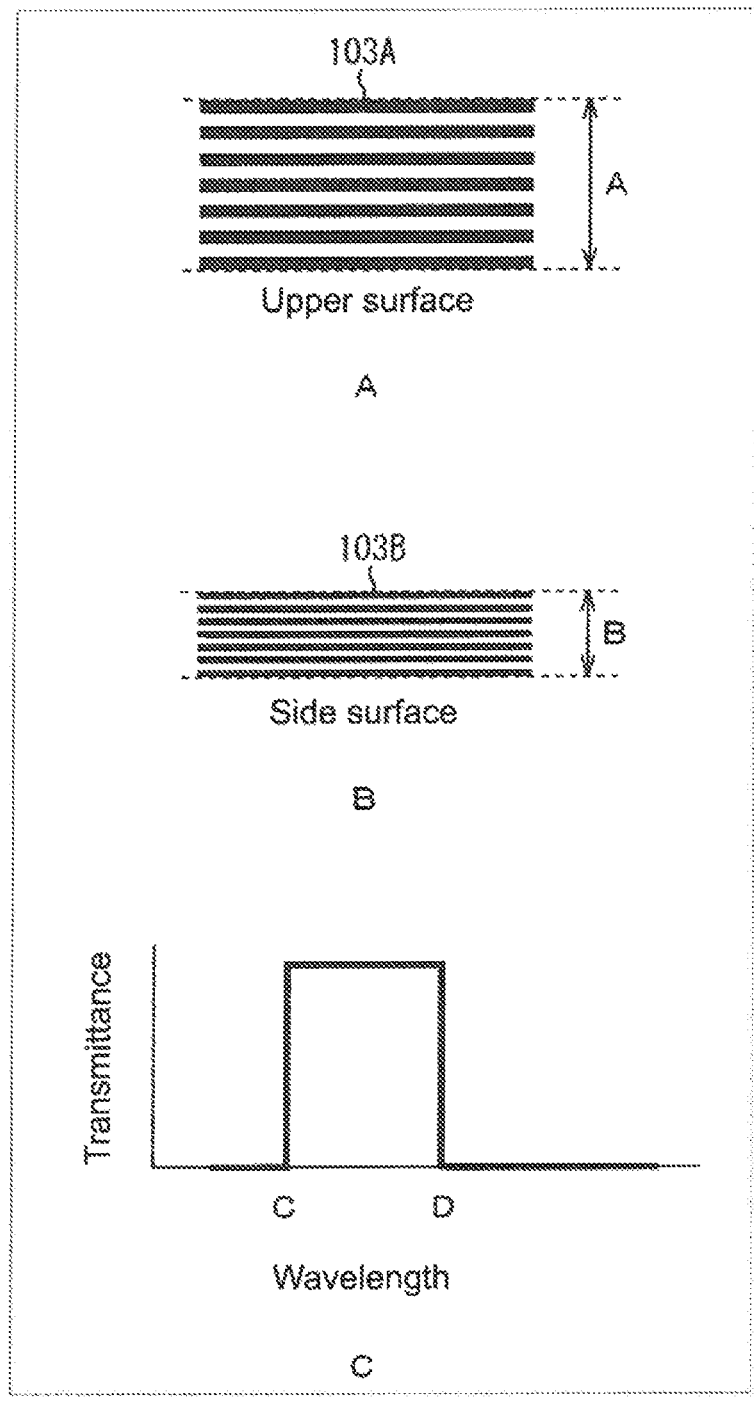
[FIG. 6] Diagrams for explaining an example of transmission wavelength characteristics design.

As shown in FIG. 6A, the thickness of the moisture-resistant film 103A as the inorganic film on the light-incident surface (upper surface) of the infrared cut filter 102 as the organic film is represented by A. In addition, as shown in FIG. 6B, the thickness of the moisture-resistant film 103B as the inorganic film on the side surfaces of the infrared cut filter 102 as the organic film is represented by B. In addition, as shown in FIG. 6C, a lower limit of the wavelength that is transmitted through the moisture-resistant film 103A as the inorganic film on the light-incident surface (upper surface) of the infrared cut filter 102 as the organic film is represented by C, and an upper limit thereof is represented by D.

In this case, the thickness B of the moisture-resistant film 103B may be calculated by the following expression (1) or (2).

$$B \approx C/D * A \quad (1)$$

or $$B < C/D * A \quad (2)$$

Specifically, a ratio of the thickness of the inorganic film formed by being laminated on the side surfaces of the organic film to the thickness of the inorganic film formed by being laminated on the light-incident surface of the organic film can be set to be equal to or smaller than a ratio of the lower limit wavelength of the wavelength range that is transmitted through the inorganic film formed by being laminated on the light-incident surface of the organic film to the upper limit wavelength of the wavelength range.

Further, the side surface lamination thickness may be set to be within a 10-point width of a ratio obtained by dividing the shortest wavelength for transmitting visible light by the shortest wavelength for removing infrared light, with respect to the upper surface lamination thickness.

For example, when the transmission band is 400 nm to 650 nm and the remaining band is the removal band, with the upper surface lamination thickness being represented by A, the side surface lamination thickness is set to be about 0.615 A (0.615=400/650) and does not strictly need to be 0.62 A. The side surface lamination thickness of 0.615 A or less can cut 400 nm or more, so it can be set as extremely as 0.2 A. Moreover, the side surface lamination thickness of 0.6 A can cut 390 nm or more, and the side surface lamination thickness of 0.64 A can cut 420 nm or more.

<Control of Transmission Wavelength Range of Side Surfaces>

Further, as described above, by changing the thickness of the moisture-resistant film 103B with the thickness of the moisture-resistant film 103A, the wavelength range that is transmitted through the side surfaces of the infrared cut filter 102 can be shifted from the wavelength range that is transmitted through the light incident surface.

For example, as the thickness of the moisture-resistant film 103B is made thinner with respect to the thickness of the moisture-resistant film 103A, the wavelength range that is transmitted through the side surfaces of the infrared cut filter 102 can be shifted more on the short wavelength side. It is for the purpose of suppressing transmission of visible light, the thickness of the moisture-resistant film 103B only needs to be made thinner than that when the upper limit of the wavelength range that is transmitted through the side surfaces of the infrared cut filter 102 becomes the lower limit of the wavelength range of visible light.

Conversely, as the thickness of the moisture-resistant film 103B is made thicker with respect to the thickness of the moisture-resistant film 103A, the wavelength range that is transmitted through the side surfaces of the infrared cut filter 102 can be shifted more on the long wavelength side. If it is for the purpose of suppressing transmission of visible light, the thickness of the moisture-resistant film 103B only needs to be made thicker than that when the lower limit of the wavelength range that is transmitted through the side surfaces of the infrared cut filter 102 becomes the upper limit of the wavelength range of visible light.

It should be noted that since the spectral transmittance property of the multilayer film has an incident angle dependency, there is strictly a need to provide the multilayer film while taking into account the presumable tilt angle of the moisture-resistant film 103B (side surfaces) and incident angle of light beams.

<Optical Property Control Based on Number of Layers of Side Surfaces>

Figure 7:
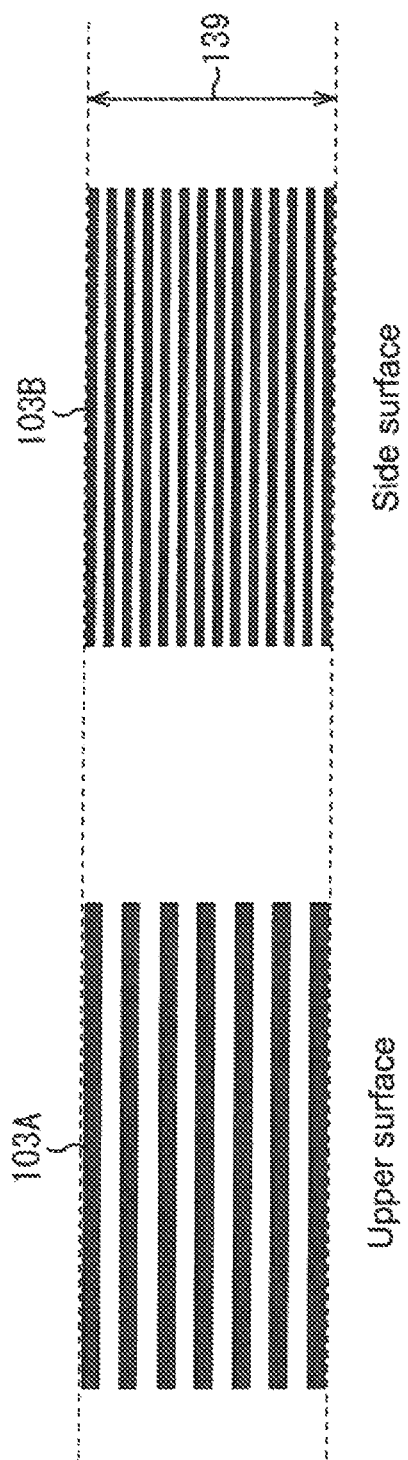
[FIG. 7] A diagram for explaining a structural example of an inorganic film.

It should be noted that it is also possible to control the wavelength range for transmission and the wavelength range for suppressing transmission (transmission spectral property) by controlling the number of layers of the moisture-resistant film 103B laminated on the side surfaces of the infrared cut filter 102 as the organic film as shown in FIG. 7, for example.

In a case where the formation of the moisture-resistant film 103 (inorganic film) on the side surfaces of the infrared cut filter 102 as the organic film and the formation of the moisture-resistant film 103 (inorganic film) on the light-incident surface (upper surface) of the infrared cut filter 102 (including formation of moisture-resistant film in peripheral section of infrared cut filter 102) are carried out in different steps using a mask as will be described later, the number of layers of the moisture-resistant film 103A on the light-incident surface (upper surface) and that of the moisture-resistant film 103B on the side surfaces can be set independently.

When the thickness of the moisture-resistant film 103A and that of the moisture-resistant film 103B are the same (thickness 139) as shown in FIG. 7, if the numbers of layers differ, the thicknesses of the layers also differ. Therefore, by controlling the number of layers as in the case of controlling the thickness described above, the wavelength range of light that is transmitted through the side surfaces can be controlled. For example, it is possible to inhibit light of the wavelength range that is transmitted through the light-incident surface of the infrared cut filter 102 from being transmitted through the side surfaces of the infrared cut filter 102. Therefore, it is possible to suppress lowering of image quality of pickup images obtained by the image pickup device 101.

<Thickness Control Example>

Figure 8:
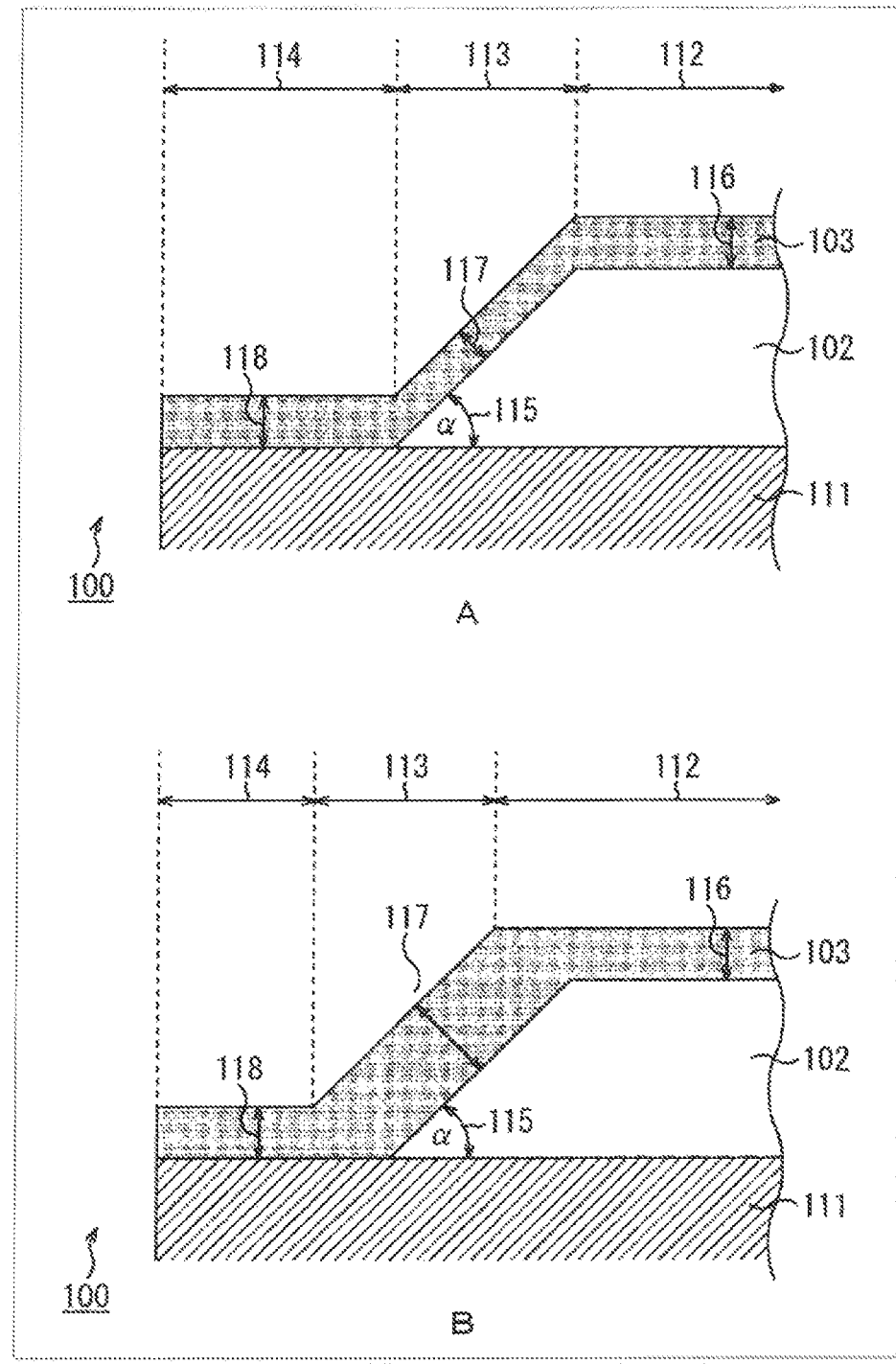
[FIG. 8] Diagrams for explaining examples of a thickness of the inorganic film.

It should be noted that the thickness 117 of the moisture-resistant film 103 at the portion of the side surface of the infrared, cut filter 102 may be made thinner than the thickness 116 thereof at the portion of the light-incident surface (upper surface) of the infrared cut filter 102 and the thickness 118 thereof at the peripheral section of the infrared cut filter 102 as shown in FIG. 8A, or thicker as shown in FIG. 8B.

<Moisture-Resistant Film in Peripheral Section>

It should be noted that although the descriptions have been given that the moisture-resistant film 103 is formed by being laminated on the layer adjacent to the surface of the infrared cut filter 102 opposite to the light-incident surface (flattening film 111) in the peripheral section of the infrared cut filter 102 while referring to FIG. 2, the moisture-resistant film 103 may be laminated on a layer lower than that shown in the figure. In other words, the moisture-resistant film 103 (inorganic film) may be formed by being laminated on a layer formed more on the other side of the light-incident surface than the layer adjacent to the surface of the infrared cut filter 102 opposite to the light-incident surface (flattening film 111) in the peripheral section of the infrared cut filter 102 as the organic film.

Figure 9:
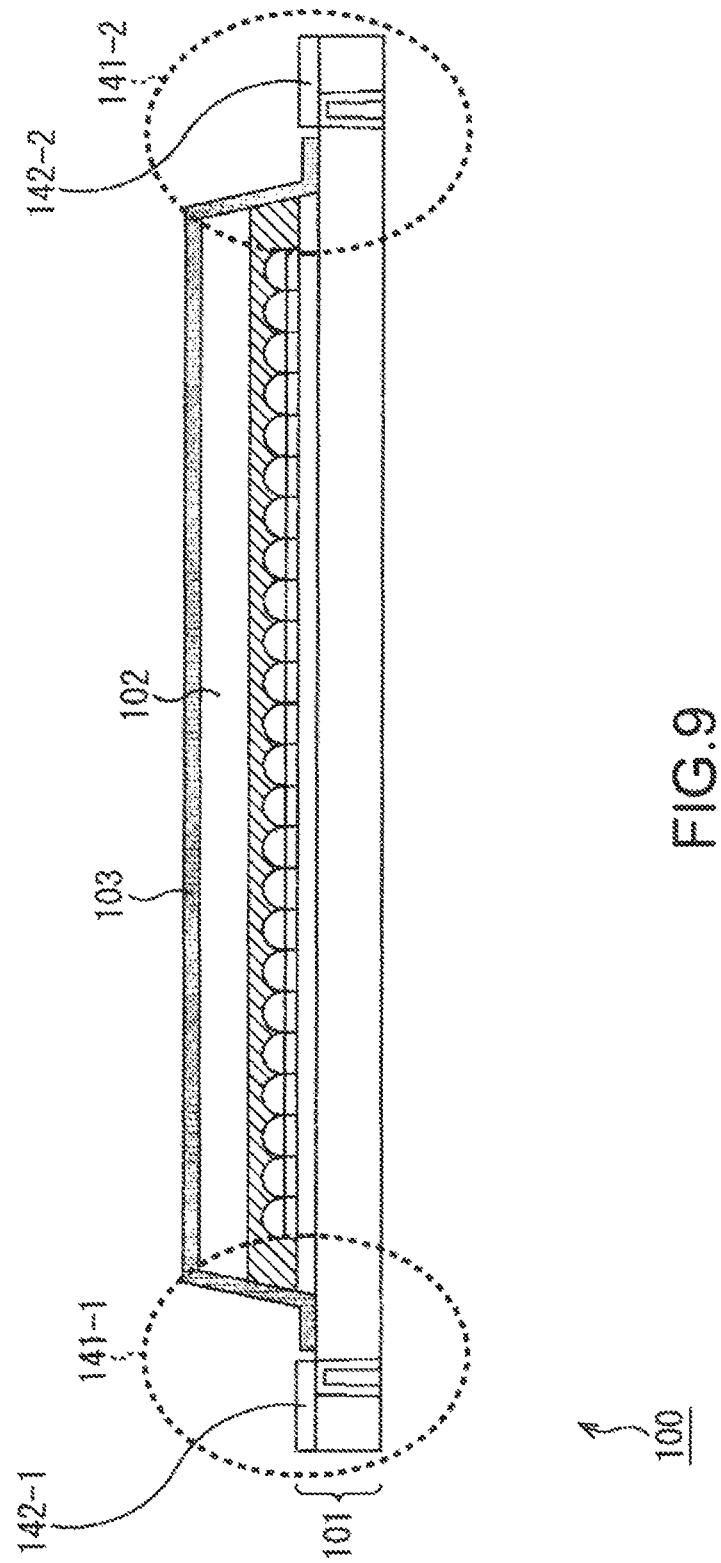
[FIG. 9] A cross-sectional diagram showing another structural example of the image pickup device.

There are cases where electrodes for connecting the wiring layer of the organic-film-attached image pickup device 100 and the outside of the organic-film-attached image pickup device 100 are formed in the peripheral section of the infrared cut filter 102 as shown in FIG. 9, for example. In the case of the example shown in FIG. 9, an electrode 142-1 is formed in the peripheral section of the infrared cut filter 102 surrounded by the dotted line 141-1. In addition, an electrode 142-2 is formed in the peripheral section of the infrared cut filter 102 surrounded by the dotted line 141-2. In the descriptions below, unless there is no need to distinguish the electrodes 142-1 and 142-2 from each other, the electrodes will simply be referred to as electrodes 142.

In such a case, the peripheral sections of the infrared cut filter 102 is etched such that the electrodes 142 are exposed. In other words, the moisture-resistant film 103 is formed by being laminated on a layer formed more on the other side of the light-incident surface (more specifically, layer on which electrodes 142 are formed) than the layer that is in contact with the surface of the organic film opposite to the light-incident surface (flattening film 111).

With such a structure, the moisture-resistant film 103 can be deposited at portions other than the electrodes 142 while the electrodes 142 are exposed, with the result that moisture permeation into the infrared cut filter 102 can more-positively be suppressed.

It should be noted that the method of exposing the electrodes is arbitrary. Further, also in this case, the organic-film-attached image pickup device 100 may include the transparent layer 124 formed by being laminated on the light-incident surface of the moisture-resistant film 103 as in the case of FIG. 3. The transparent layer 124 is formed of, for example, glass (e.g., quartz) or resin. In addition, the ribs 125 may be formed between the moisture-resistant film 103 and the transparent layer 124 on the side surfaces or in the peripheral section of the infrared cut filter 102.

<Multilayer Moisture-Resistant Film>

Further, the moisture-resistant film 103 may be formed as a plurality of layers.

In other words, a plurality of moisture-resistant films 103 may be laminated. For example, a moisture-resistant film 143 may be formed by being laminated on the surface of the infrared cut filter 102 opposite to the light-incident surface as shown in the example of FIG. 10.

The moisture-resistant film 143 is a protection film (inorganic film) that is formed of an inorganic material and protects the flattening film (hatched portion of figure) as the organic film formed above the image pickup device 101 in the figure. The moisture-resistant film 143 is an organic film similar to the moisture-resistant film 103 described above, protects the flattening film, and suppresses moisture permeation into the flattening film. In other words, the moisture-resistant film 143 is deposited in a thickness with which moisture permeation into the flattening film can be sufficiently suppressed.

The moisture-resistant film 143 may have a single-layer structure like the moisture-resistant film 103 shown in the example of FIG. 2 and the like or may have a multilayer structure like the moisture-resistant film 103 shown in the example of FIG. 5B and the like. In the example of FIG. 10, the moisture-resistant film 143 and the moisture-resistant film 103 may have the same structure or may have different structures. Moreover, the thicknesses thereof may be the same or may differ.

Figure 10:
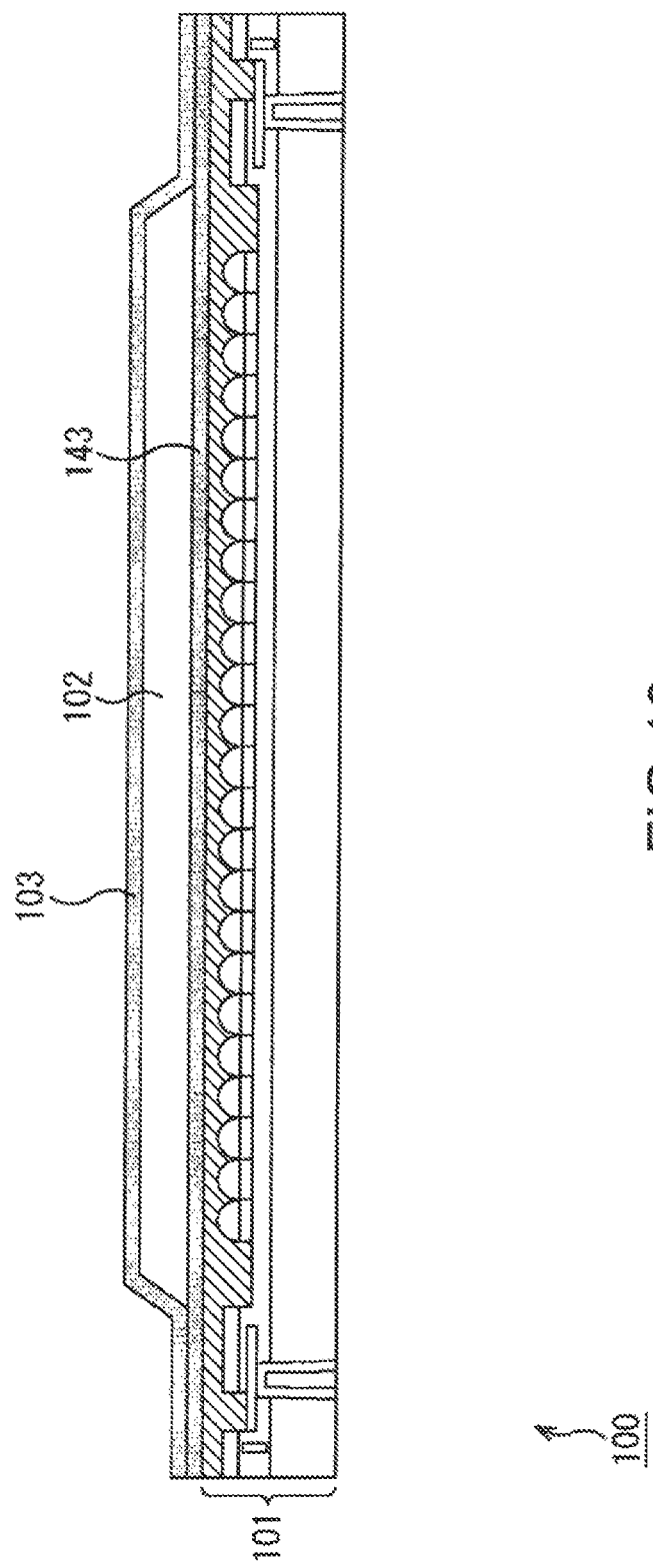
[FIG. 10] A cross-sectional diagram showing another structural example of the image pickup device.

As shown in FIG. 10, the infrared cut filter and the moisture-resistant film 103 are laminated above such a moisture-resistant film 143 in the figure. In other words, the infrared cut filter 102 is formed between the moisture-resistant film 103 and the moisture-resistant film 143, and all the surfaces of the infrared cut filter 102 are completely sealed by the moisture-resistant film 103 and the moisture-resistant film 143. Therefore, the moisture-resistant film 143 can additionally suppress moisture permeation into the infrared cut filter 102.

<Oxygen-Resistant Film>

Heretofore, the moisture-resistant film 103 has been described as an example of the inorganic film formed of an inorganic material, but this inorganic film may be any film as long as it is a layer formed as the protection film that protects the organic film. For example, the inorganic film may be an oxygen-resistant film (oxygen barrier) that suppresses oxygen permeation into the organic film as the protection, target, for example. Moreover, for example, the inorganic film may be a protection film that suppresses permeation of both moistures and oxygen (has both moisture resistance and oxygen resistance). In other words, the inorganic film may include both functions as the moisture-resistant film and the oxygen-resistant film.

The organic film like the infrared cut filter 102 has low oxygen resistance and is apt to be deteriorated due to permeation of oxygen (apt to be optically influenced). Therefore, by forming such an oxygen-resistant film (inorganic film) by laminating it on the surface of the infrared cut filter 102 including at least the light-incident surface and the side surfaces so as to seal the infrared cut filter 102, deterioration of the infrared cut filter (organic film) due to oxygen permeation can be suppressed.

In other words, the moisture-resistant film 103 as the protection film of the organic film described above may include not only the performance of suppressing moisture permeation into the organic film as the protection target (moisture resistance) but also the performance of suppressing oxygen permeation into the organic film as the protection target (oxygen resistance). In this case, the thickness of the moisture-resistant film 103 is desirably a thickness with which a sufficient effect as the protection film can be obtained. In addition, the thickness with which sufficient oxygen resistance can be obtained is generally larger than that with which sufficient moisture resistance can be obtained. In other words, in this case, the side surfaces of the infrared cut filter 102 are tilted by an angle at which the thickness 117 of the moisture-resistant film 103 (inorganic film) becomes a thickness with which sufficient oxygen resistance can be obtained. Further, by the tilt, the moisture resistant film 103 is formed in a thickness with which sufficient oxygen resistance can be obtained.

<Effects>

As described heretofore, in the case of the organic-film-attached image pickup device 100, the protection performance of the optical filter (organic film) can be improved by covering the optical filter as the organic film by the inorganic protection film. Moreover, since the inorganic protection film is provided close to image pickup pixels while being provided with the function as the multilayer film optical filter so as to perform spectral correction, ghost flare properties can be improved.

It should be noted that the principle by which ghost flares are reduced is that normally, when the infrared cut filter as the multilayer film is provided in an image pickup optical channel, light reflected by an image pickup device surface reaches the infrared cut filter to be reflected again and reaches the image pickup device surface again, lithe image pickup device and the infrared cut filter are provided apart from each other, light that has entered the image pickup device the first time is largely deviated in position due to reciprocating reflections, and this is recognized as ghosts and flares. However, when the same infrared cut filter is provided close to the image pickup device, the positional deviation due to reciprocating reflections becomes a negligible amount (1 pixel or less to about few pixels) to not be recognized as ghosts or flares and is recognized as a blur of a point image.

By changing the spectral transmittance property of the side surfaces of the infrared cut filter 102 as the organic film to, for example, a property for removing visible light, visible light is transmitted through the light-incident surface (upper surface) to be imaged, and ghosts and flares due to incident light from the side surfaces can be reduced.

Further, also when laminating the light-incident surface (upper surface) and side surfaces of the infrared cut filter 102 as the organic film at the same time, the infrared cut wavelength band of the light-incident surface (upper surface) is shifted since the thickness of each layer of the multilayer film of the inorganic film (moisture-resistant film 103) on the side surfaces becomes proportionally thin with respect to the multilayer film thickness of the light-incident surface (upper surface), and visible light incident components are reflected to be reduced (not completely due to ripples but large portion is reflected).

Furthermore, when attaching a glass substrate 271 and the image pickup device 101, even when there is an external impact or the like, the ribs can absorb the impact as a buffer. Alternatively, since a crack is stopped by the ribs, the crack does not influence the moisture-resistant film. Since the multilayer film optical filter is provided close to the image pickup pixels while being capable of performing spectral correction, red ghost flare properties can be improved. Since there is no glass on the multilayer film of the optical filter, the optical system can be made thin. By the multilayer film, visible light incident components from side walls are reduced by the reflection.

Heretofore, the descriptions have been made using the infrared cut filter 102 as an example of the organic film formed of an organic material. However, the organic film to be protected by the inorganic film may be any film as long as it is a layer formed of an organic material. Moreover, the shape of the organic film may be any shape as long as it has the light-incident surface and side surfaces as described above. For example, the organic film may be formed only in a part of an effective pixel area or may be formed in a pixel unit.

<2. Second Embodiment>
<Production Apparatus>

Next, production of the organic-film-attached image pickup device 100 as described above will be described.

As the production method of the organic-film-attached image pickup device 100, for example, there is a method of forming a portion of the inorganic film, that is laminated on the light-incident surface of the organic film, and a portion thereof that is laminated on the side surfaces in the same step. There is also a method of forming a portion of the inorganic film, that is laminated on the light-incident surface of the organic film, and a portion thereof that is laminated on the side surfaces in different steps using a mask, for example. In addition, there is a method of producing the organic-film-attached image pickup device 100 by forming an inorganic film or the like by laminating it on a transparent layer formed of glass (e.g., quartz), resin, or the like and attaching that structure with an image pickup device.

<Production Apparatus in Case of Same Step>

First, the method of forming a portion of the inorganic film, that is laminated on the light-incident surface of the organic film, and a portion thereof that is laminated on the side surfaces in the same step will be described.

Figure 11:
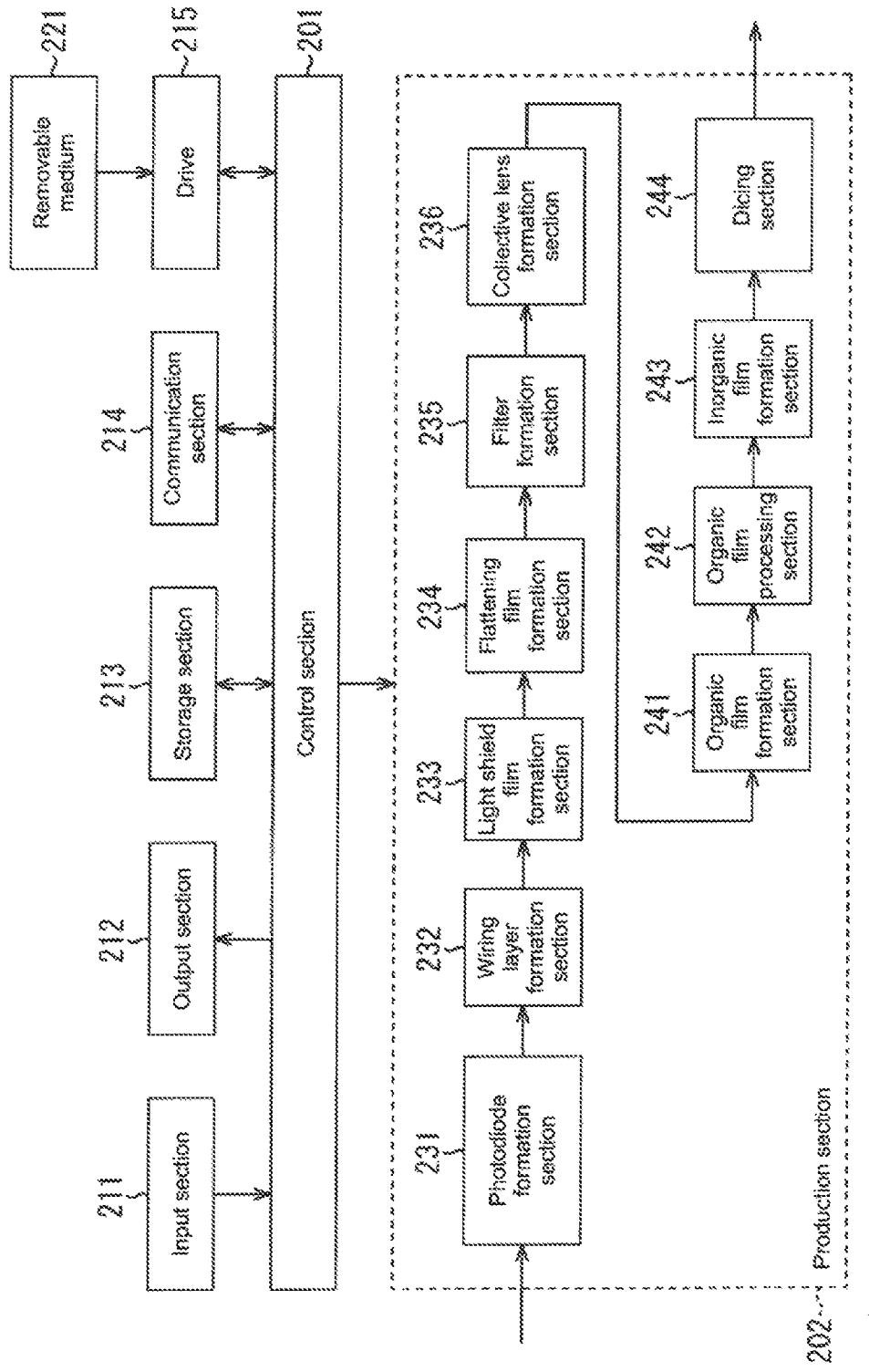
[FIG. 11] A block diagram showing a main structural example of a production apparatus.

FIG. 11 is a block diagram showing a main structural example of a production apparatus that produces the organic-film-attached image pickup device 100 (image sensor) to which the present technique is applied. The production apparatus 200 shown in FIG. 11 includes a control section 201 and a production section 202.

The control section 201 includes, for example, a CPU (Central Processing Unit), a ROM (Read Only Memory), and a RAM (Random Access Memory), controls respective sections of the production section 202, and carries out control processing related to the production of the organic-film-attached image pickup device 100. For example, the CPU of the control section 201 executes various types of processing according to programs stored in the ROM. The CPU also executes various types of processing according to programs loaded to the RAM from a storage section 213. The RAM also stores as appropriate data requisite for the CPU to execute the various types of processing.

The production section 202 carries out processing related to the production of the organic-film-attached image pickup device 100 under control of the control section 201. The production section 202 includes a photodiode formation section 231, a wiring layer formation section 232, a light shield film formation section 233, a flattening film formation section 234, a filter formation section 235, a collective lens formation section 236, an organic film formation section 241, an organic film processing section 242, an inorganic film formation section 243, and a dicing section 244.

The photodiode formation section 231 forms a photodiode (photoelectric conversion device) on a silicon substrate. The wiring layer formation section 232 forms a wiring layer (not shown) on a surface of the silicon substrate opposite to a light-incident surface (lower side of FIG. 1). The light shield film formation section 233 forms a light shield film. The flattening film formation section 234 forms a flattening film. The filter formation section 235 forms a color filter. The collective lens formation section 236 forms a collective lens.

The organic film formation section 241 forms an organic film. The organic film processing section 242 processes the side surfaces of the organic film formed by the organic film formation section 241 and causes the side surfaces to be tilted by an angle at which the thickness of the inorganic film formed by being laminated on the side surfaces becomes a predetermined thickness.

The inorganic film formation section 243 forms an inorganic film by the method of, for example, CVD or vapor deposition to seal the organic film. At this time, the inorganic film formation section 243 forms the inorganic film formed by being laminated on both the light-incident surface and side surfaces of the organic film in the same step.

The dicing section 244 dices the organic-film-attached image pickup device 100 into individual pieces.

The photodiode formation section 231 to the dicing section 244 are controlled by the control section 201 and carry out processing of the steps for producing the organic-film-attached image pickup device 100 as will be described later.

Further, the production apparatus 200 includes an input section 211, an output section 212, a storage section 213, a communication section 214, and a drive 215.

The input section 211 is constituted of a keyboard, a mouse, a touch panel, an external input terminal, and the like, accepts inputs of user instructions and external information, and supplies them to the control section 201. The output section 212 is constituted of a display such as a CRT (Cathode Ray Tube) display and an LCD (Liquid Crystal Display), a speaker, an external output terminal, and the like and outputs various types of information supplied from the control section 201 as images, audios, analog signals, and digital data.

The storage section 213 includes an arbitrary storage medium such as a flash memory, an SSD (Solid State Drive), and a hard disk, stores information supplied from the control section 201, and reads out and supplies the stored information according to requests from the control section 201.

The communication section 214 is constituted of, for example, an interface or modem for a wired LAN (Local Area Network) and a wireless LAN and carries out communication processing with an external apparatus via a network including the Internet. For example, the communication section 214 transmits information supplied from the control section 201 to a communication counterpart or supplies information received from the communication counterpart to the control section 201.

The drive 215 is connected to the control section 201 as necessary. Further, a removable medium 221 such as a magnetic disk, an optical disc, a magneto-optical disc, and a semiconductor memory is loaded into the drive 215 as appropriate. Then, computer programs read out from the removable medium 221 via the drive 215 are installed in the storage section 213 as necessary.

<Flow of Production Processing in Case of Same Step>

Referring to the flowchart of FIG. 12, an example of the flow of production processing for producing the organic-film-attached image pickup device 100, that is executed by the production apparatus 200 in this case will be described.

As the production processing is started, the photodiode formation section 231 forms, for each pixel, a photodiode (photoelectric conversion device) on a silicon substrate supplied from outside in Step S201 under control of the control section 201.

In Step S202, the wiring layer formation section 232 forms, under control of the control section 201, a wiring layer (not shown) including a multilayer wiring that uses metal such as copper and aluminum while laminating it on a surface of the silicon substrate opposite to the light-incident surface on which the photodiode has been formed (lower side in FIG. 1).

In Step S203, the light shield film formation section 233 forms a light shield film at a pixel circumferential section of the silicon substrate under control of the control section 201.

In Step S204, the flattening film formation section 234 forms a flattening film while laminating it on the silicon substrate on which the light shield film has been formed under control of the control section 201.

In Step S205, the filter formation section 235 forms a color filter while laminating it on the flattening film under control of the control section 201.

In Step S206, the collective lens formation section 236 forms a collective lens while laminating it on the color filter under control of the control section 201.

Figure 13:
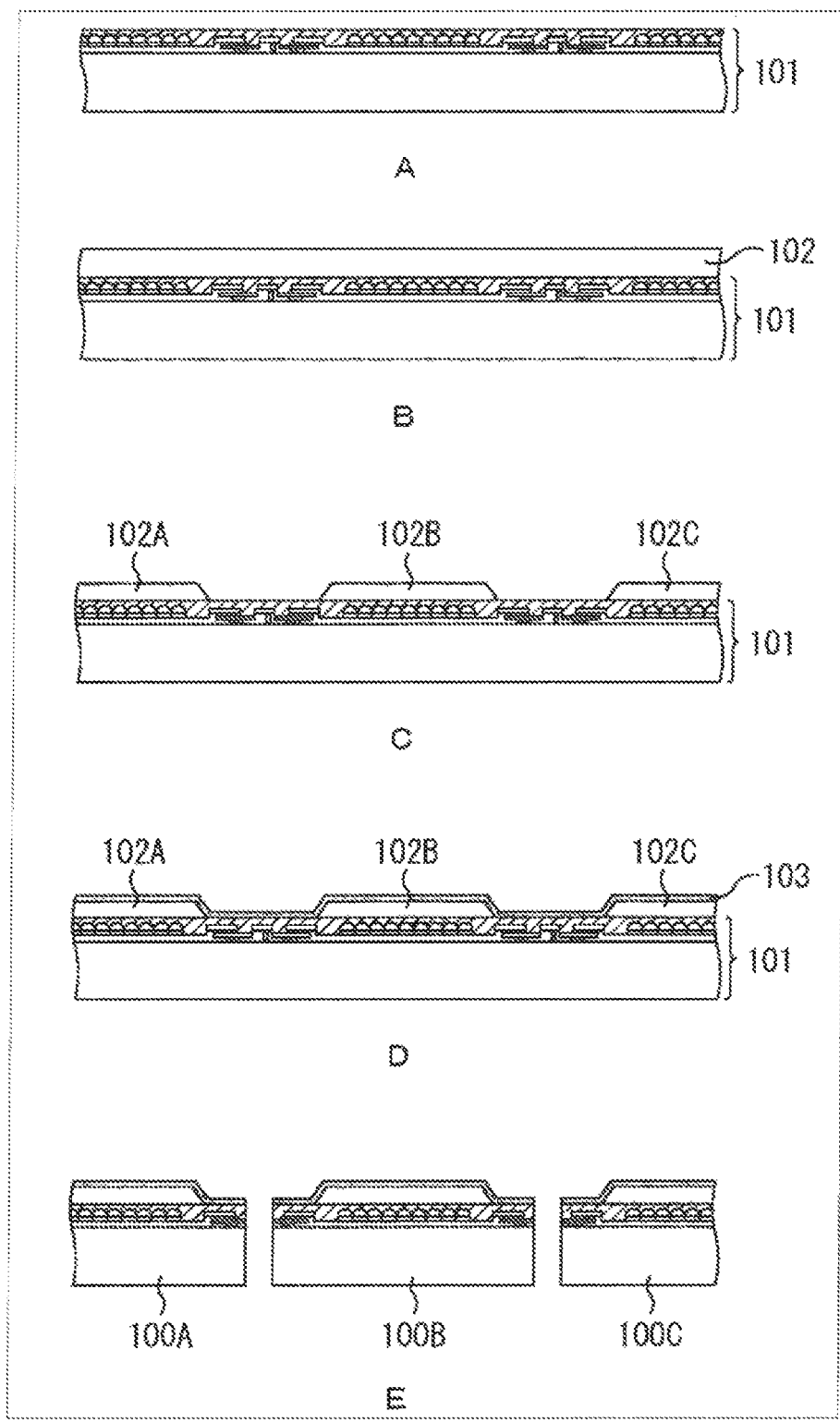
[FIG. 13] Diagrams for explaining an example of a state of production steps.

As described above, the structure of the image pickup device 101 is formed as shown in FIG. 13A. It should be noted that the structure of the image pickup device 101 is arbitrary, and the production method therefor is also not limited to the example described above.

In Step S207, the organic film formation section 241 forms an organic film (infrared cut filter 102) on the light-incident surface of the image pickup device 101 by a spin coat method or the like under control of the control section 201 (FIG. 13B).

After curing of the organic film, in Step S208, the organic film processing section 242 processes the organic film (infrared cut filter 102) formed in Step S207 by etching or the like under control of the control section 201, and forms an organic film for each image pickup device (infrared cut filters 102A to 102C) in which the side surfaces are tilted by a predetermined angle α (FIG. 13C).

In Step S209, the inorganic film formation section 243 forms an inorganic film (moisture-resistant film 103) in a thickness with which sufficient moisture resistance can be obtained by the method of CVD vapor deposition, or the like from the light-incident surface side of the organic film, so as to seal the organic film for each image pickup device (infrared cut filters 102A to 102C) generated by the processing of Steps S207 and S208 under control of the control section 201 (FIG. 13D).

In other words, in this step, the inorganic film formation section 243 forms the inorganic film (moisture-resistant film 103) on both the light-incident surface and side surfaces of the organic films (infrared cut filters 102A to 102C) without using a mask.

The inorganic film (moisture-resistant film 103) may either have a single-layer structure or a multilayer structure as described in the first embodiment. Moreover, as described above with reference to FIGS. 5 to 7, when controlling the transmission wavelength range of the side surfaces of the organic film (infrared cut filter 102), the thickness of the portion laminated on the side surfaces of the organic film (infrared cut filter 102) is controlled as described above in the first embodiment.

In Step S210, the dicing section 244 dices the structure produced as described above into individual organic-film-attached image pickup devices (organic-film-attached image pickup devices 100A to 100C) under control of the control section 201 (FIG. 13E).

Upon ending the processing of Step S210, the individual organic-film-attached image pickup devices are supplied to an external apparatus of the production apparatus 200, and the production processing is ended.

By executing the production processing as described above, the production apparatus 200 can generate the organic-film-attached image pickup device 100 (FIG. 1) to which the present technique is applied. In other words, by performing the production as described above, the layers of the organic film can be positively sealed by the inorganic film, and protection performance of the organic film can be improved.

<Production Apparatus in Case of Separate Steps>

Next, the method of forming a portion of the inorganic film laminated on the light-incident surface of the organic film and a portion thereof laminated on the side surfaces in different steps will be described.

Figure 14:
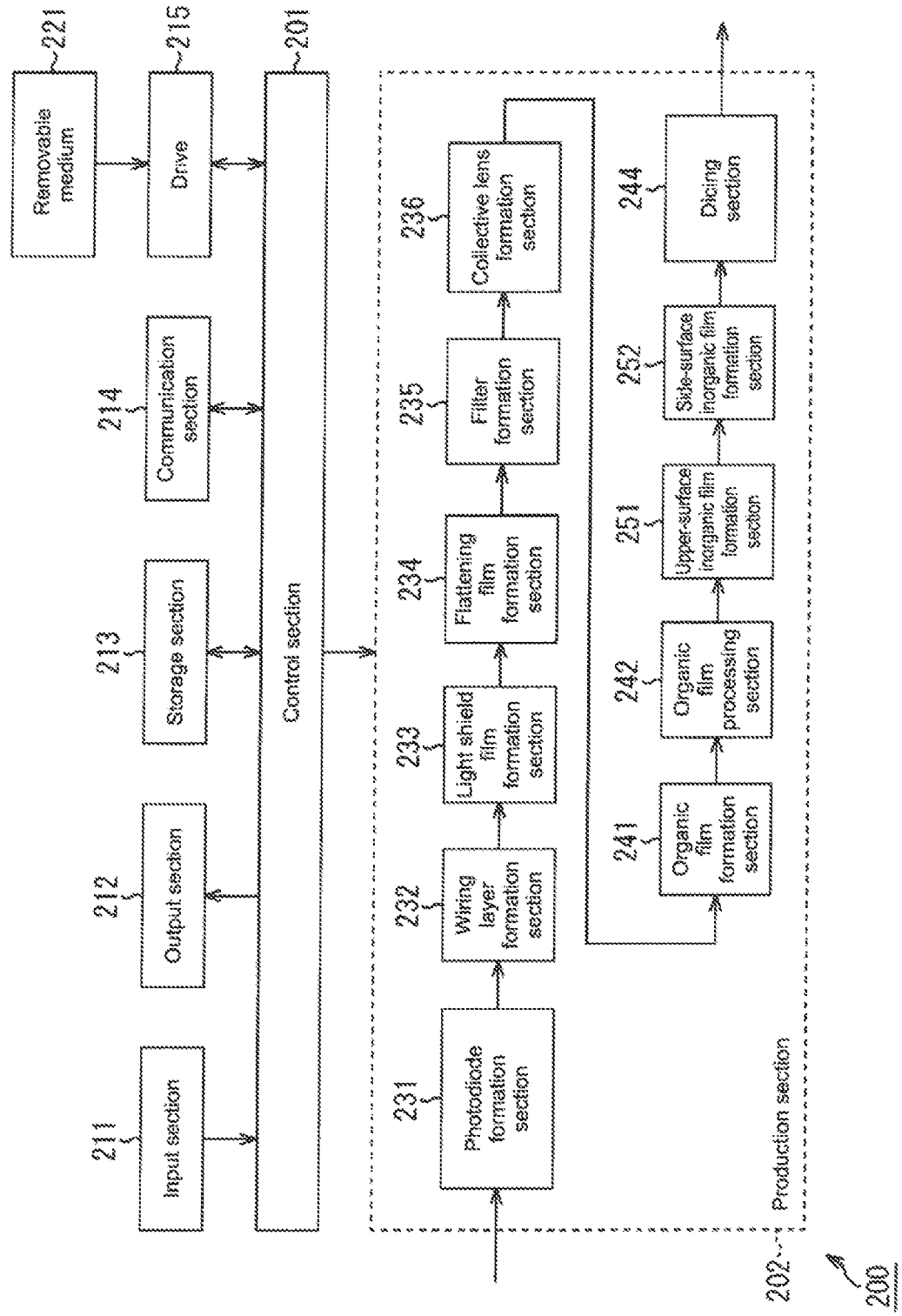
[FIG. 14] A block diagram showing another structural example of the production apparatus.

FIG. 14 is a block diagram showing a main structural example of a production apparatus that produces the organic-film-attached image pickup device 100 (image sensor) to which the present technique is applied. In FIG. 14, the production apparatus 200 basically has a structure similar to that of the case shown in FIG. 11.

It should be noted that in the case of FIG. 14, an upper-surface inorganic film formation section 251 and a side-surface inorganic film formation section 252 are provided in place of the inorganic film formation section 243 of the production section 202 shown in FIG. 11.

The upper-surface inorganic film formation section 251 forms an inorganic film only on the Light-incident surface (upper surface) of the organic film (infrared cut filter 102) using a mask.

In addition, the side-surface inorganic film formation section 252 forms an inorganic film only on the side surfaces of the organic film (infrared cut filter 102) using a mask.

In other words, the upper-surface inorganic film formation section 251 and the side-surface inorganic film formation section 252 form the inorganic films laminated on the light-incident surface and side surfaces of the organic film in different steps.

Other structures are the same as those of FIG. 11. The photodiode formation section 231 to the dicing section 244, the upper-surface inorganic film formation section 251, and the side-surface inorganic film formation section 252 carry out processing of the steps for producing the organic-film-attached image pickup device 100 as will be described later under control of the control section 201.

<Flow of Production Processing in Case of Separate Steps>

Referring to the flowchart of FIG. 15, an example of the flow of production. processing for producing the organic-film-attached image pickup device 100, that is executed by the production apparatus 200 in this case will be described.

Figure 12:
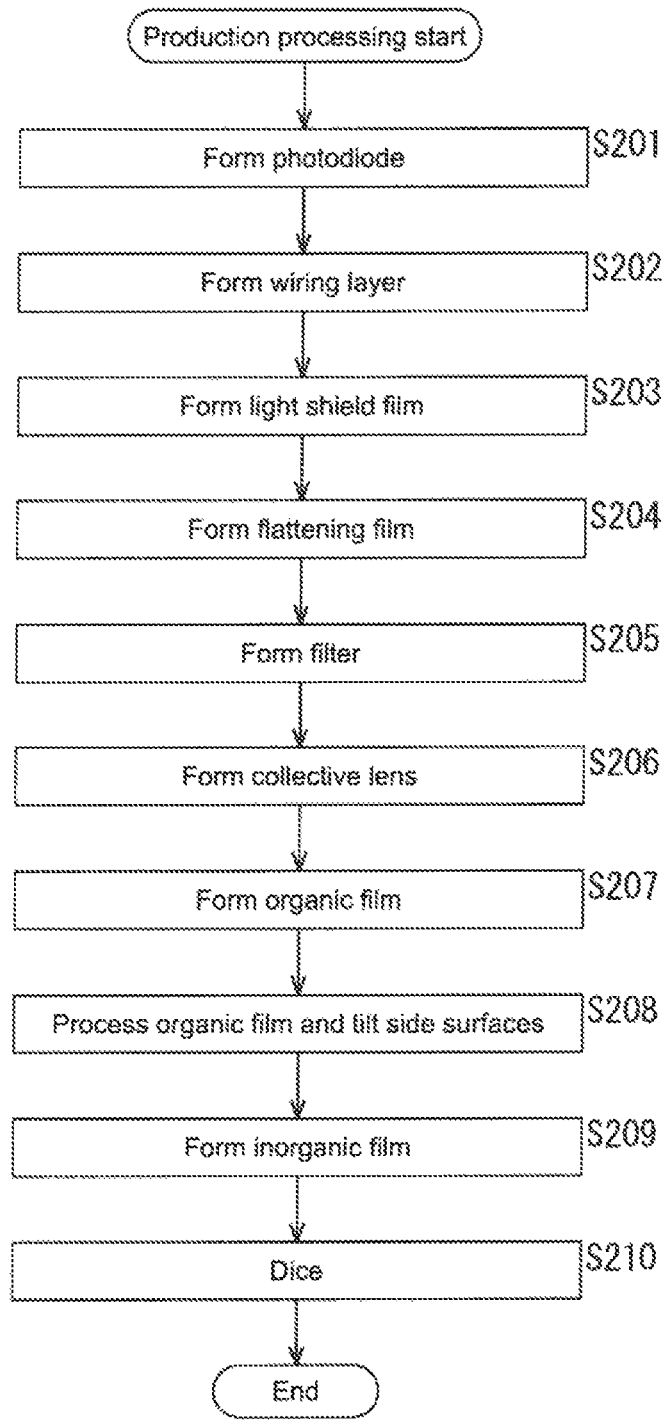
[FIG. 12] A flowchart for explaining a flow of production processing.
Figure 15:
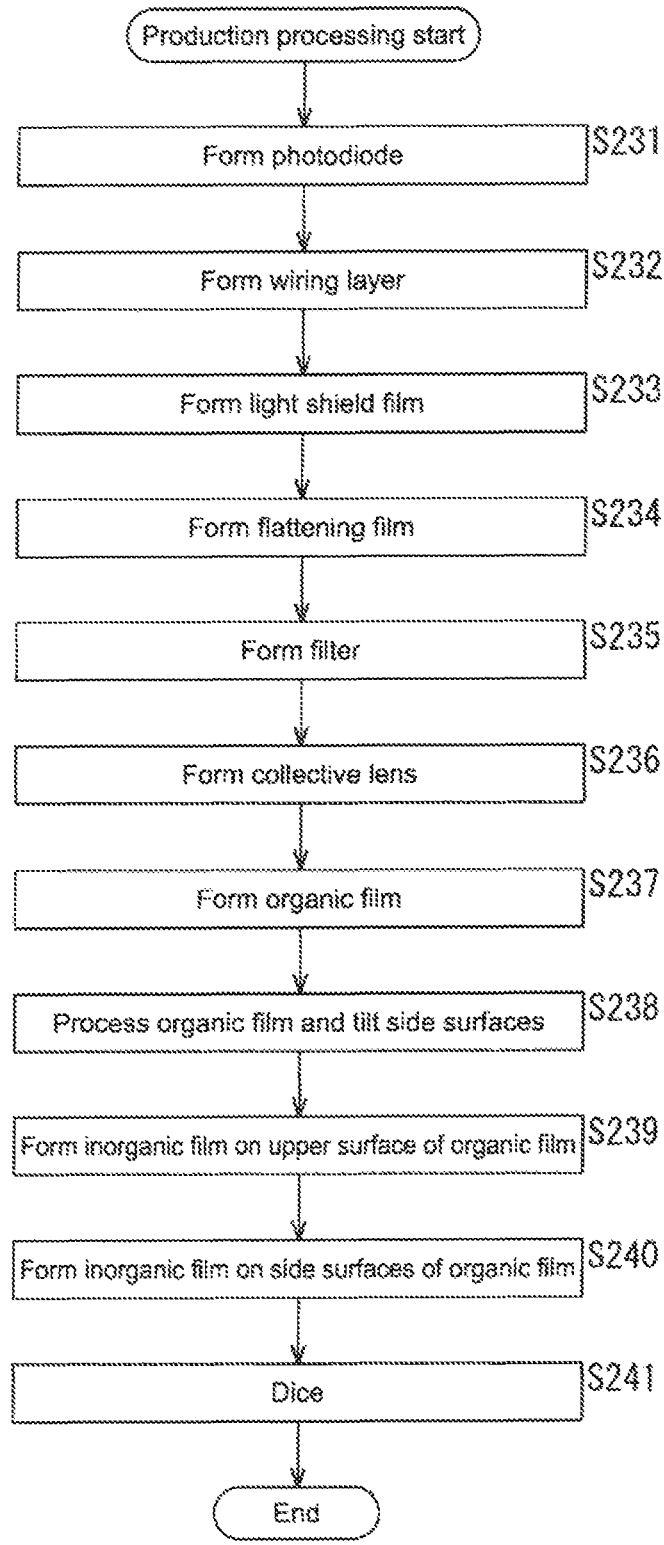
[FIG. 15] A flowchart for explaining another example of the flow of production processing.

The processing of Steps S231 to S238 in the case of FIG. 15 are executed similar to the processing of Steps S201 to S208 of FIG. 12. Therefore, for example, the image pickup device 101 is produced by the processing of Steps S231 to S236 as shown in FIG. 16A, the organic films is formed by the processing of Step 237 as shown in FIG. 16B, and the organic film for each image pickup device (infrared cut filters 102A to 102C), that has side surfaces tilted by a predetermined angle α, is formed by the processing of Step S238 as shown in FIG. 16C.

Figure 16:
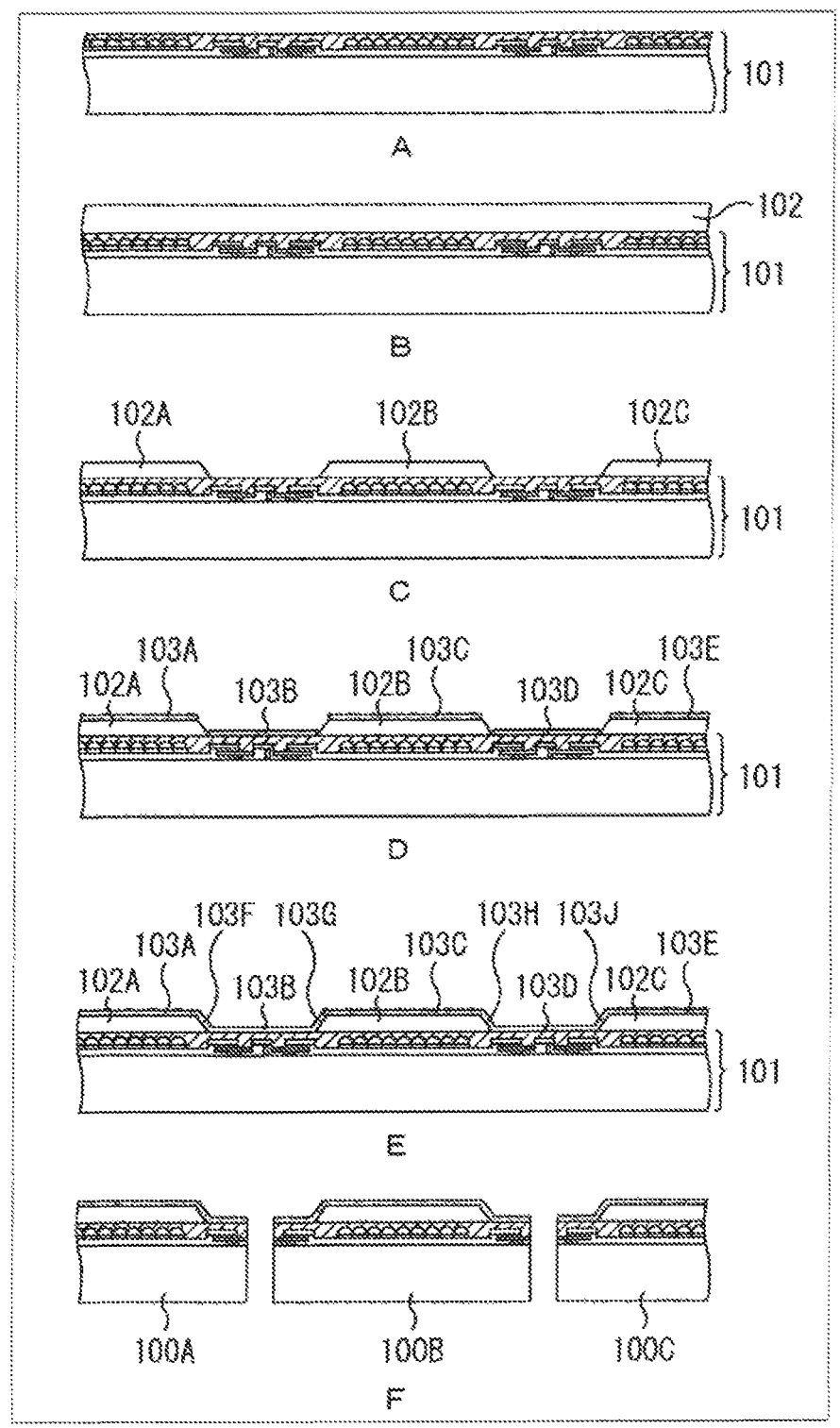
[FIG. 16] Diagrams for explaining another example of the state of production steps.

In Step S239, the upper-surface inorganic film formation section 251 masks the side surfaces of the organic films and forms inorganic films (moisture-resistant films 103A to 103E) each in a thickness with which sufficient moisture resistance can be obtained by the method of CVD, vapor deposition, or the like such that the inorganic films are laminated on the light-incident surfaces (upper surfaces) of the organic films and the peripheral sections of the organic films under control of the control section 201 (FIG. 16D).

The inorganic film (moisture-resistant film 103) may either have a single-layer structure or a multilayer structure as described in the first embodiment, it should be noted that after depositing the inorganic films, the mask on the side surfaces of the organic films is removed.

In Step S240, the side-surface inorganic film formation section 252 masks the light-incident surfaces (upper surfaces) of the organic films and the peripheral sections of the organic films and forms inorganic films (moisture-resistant films 103F to 103J) each in a thickness with which sufficient moisture resistance can be obtained by the method of CVD, vapor deposition, or the like such that the inorganic films are laminated on the side surfaces of the organic films under control of the control section 201 (FIG. 16E).

The inorganic film (moisture-resistant film 103) may either have a single-layer structure or a multilayer structure as described in the first embodiment. It should be noted that after depositing the inorganic films, the mask on the side surfaces of the organic films is removed. Moreover, as described above with reference to FIGS. 5 to 7, when controlling the transmission wavelength range of the side surfaces of the organic film (infrared cut filter 102), the thickness or the number of layers of the portion laminated on the side surfaces of the organic film (infrared cut filter 102) is controlled as described above in the first embodiment.

It should be noted that after depositing the inorganic films, masks on the light-incident surfaces (upper surfaces) of the organic films and the peripheral sections of the organic films are removed.

In Step S241, the dicing section 244 dices the structure produced as described above into individual organic-film-attached image pickup devices (organic-film-attached image pickup devices 100A to 100C) as in the case of Step S210 under control of the control section 201 (FIG. 16F).

By executing the production processing as described above, the production apparatus 200 can generate the organic-film-attached image pickup device 100 (FIG. 1) to which the present technique is applied. In other words, by performing the production as described above, the layers of the organic film can be positively sealed by the inorganic film, and protection performance of the organic film can be improved.

It should be noted that by forming the portions of the inorganic film, that are laminated on the light-incident surface and peripheral section of the organic film, and the portion thereof laminated on the side surfaces in different steps as in this example, the number of layers of the inorganic film at each portion can be set independently as described in the first embodiment. For example, the number of layers of the inorganic film laminated on the side surfaces of the organic film can be differentiated from the number of layers of the inorganic film laminated on the light-incident surface and peripheral section of the organic film. Therefore, the spectral transmittance property of the inorganic film laminated on the side surfaces of the organic film can be set more freely.

<Production Apparatus when Attaching Transparent Layer and Image Pickup Device>

Next, a method of attaching the transparent layer and the image pickup device will be described.

Figure 17:
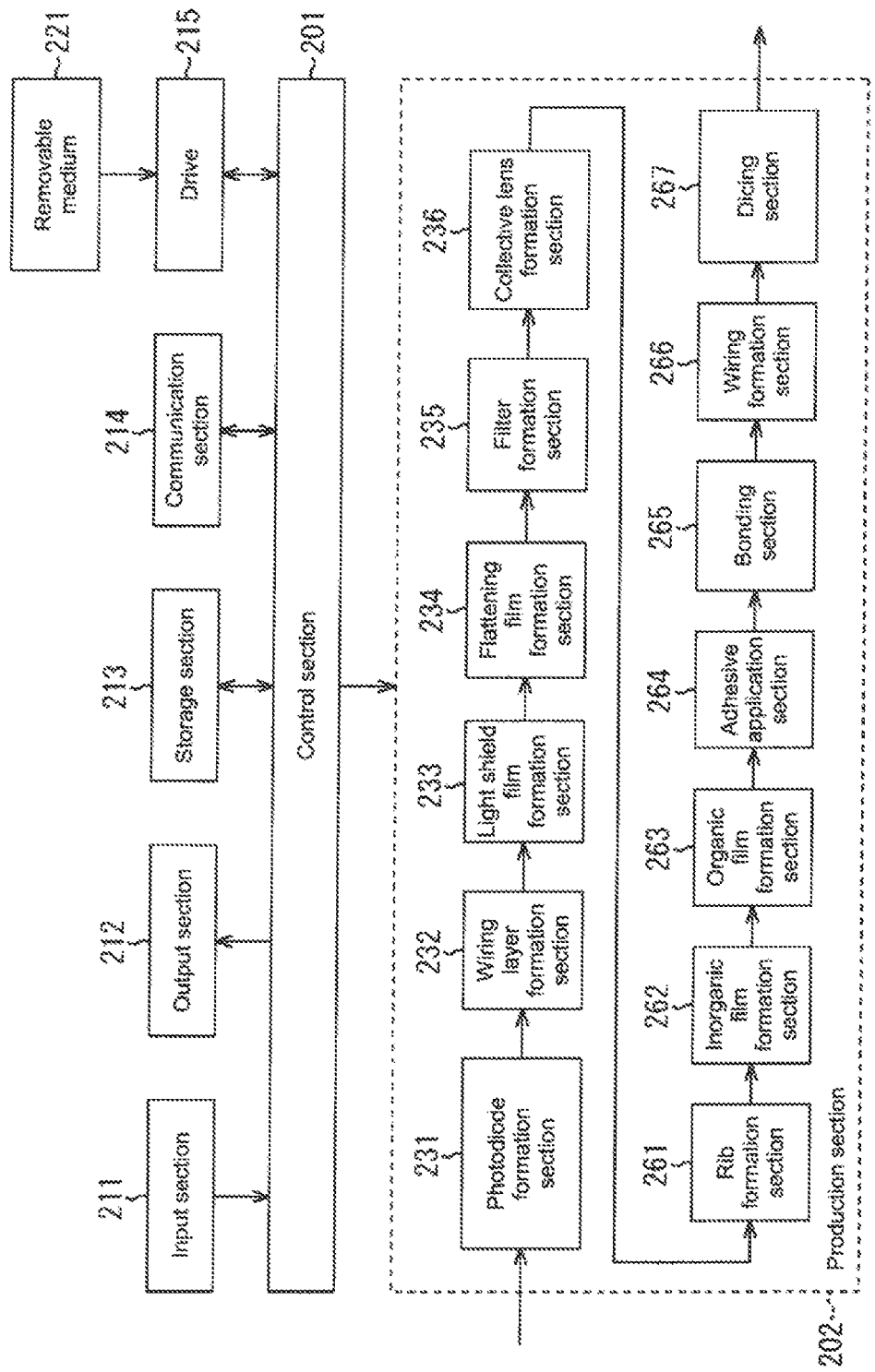
[FIG. 17] A block diagram showing another structural example of the production apparatus.

FIG. 17 a block diagram showing a main structural example of the production apparatus that produces the organic-film-attached image pickup device 100 (image sensor) (e.g., FIG. 3) to which the present technique is applied. Also in the case of FIG. 17, the production apparatus 200 basically has a structure similar to that of FIG. 11.

It should be noted that in the case of FIG. 17, a rib formation section 261, an inorganic film formation section 262, an organic film formation section 263, an adhesive application section 264, a bonding section 265, a wiring formation section 266, and a dicing section 267 are provided in place of the organic film formation section 241 to the dicing section 244 of the production section 202 shown in FIG. 11.

The rib formation section 261 forms ribs 125 between the moisture-resistant film 103 and the transparent layer 124. The inorganic film formation section 262 forms an inorganic film formed of an inorganic material as the moisture-resistant film 103 that seals the infrared cut filter 102 as the organic film. The organic film formation section 263 forms the infrared cut filter 102 as the organic film formed of an organic material. The adhesive application section 264 applies an adhesive for bonding the transparent layer 124 and the image pickup device 101 onto the transparent layer 124 on which the ribs 125, the moisture-resistant film 103, the infrared cut filter 102, and the like are formed. The bonding section 265 bonds the surface of the transparent layer 124 onto which the adhesive has been applied and the light-incident surface of the image pickup device 101. The wiring formation section 266 forms terminals, through holes, and the like. The dicing section 267 dices the organic-film-attached image pickup device 100 into individual image pickup devices.

The photodiode formation section 231 to the dicing section 267 carry out processing of the stew for producing the organic-film-attached image pickup device 100 as will be described later under control of the control section 201.

<Flow of Production Processing in Case of Bonding Transparent Layer and Image Pickup Device>

Referring to the flowchart of FIG. 18, an example of the flow of production processing for producing the organic-film-attached image pickup device 100, that is executed by the production apparatus 200 in this case will be described.

Figure 18:
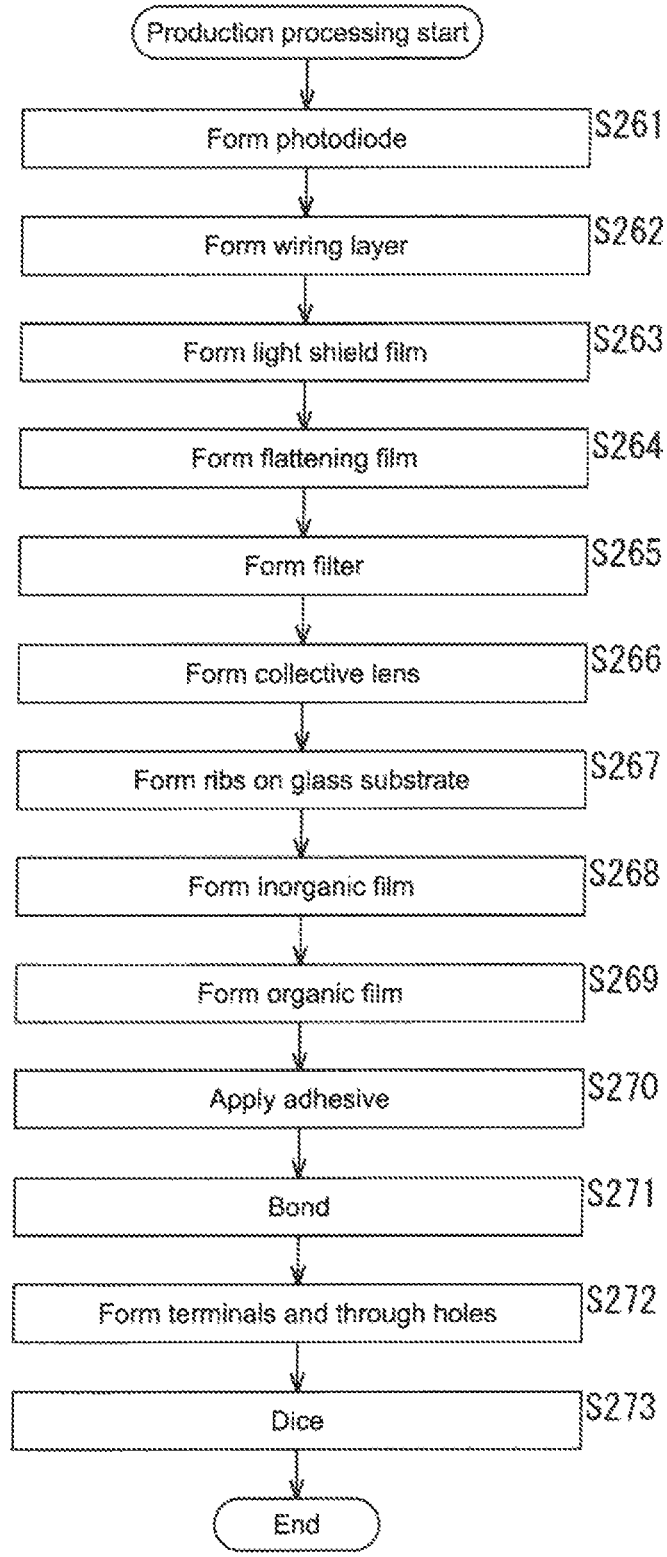
[FIG. 18] A flowchart for explaining another example of the flow of production processing.

The processing of Steps S261 to S266 in the case of FIG. 18 are executed similar to the processing of Steps S201 to S206 of FIG. 12.

Figure 19:
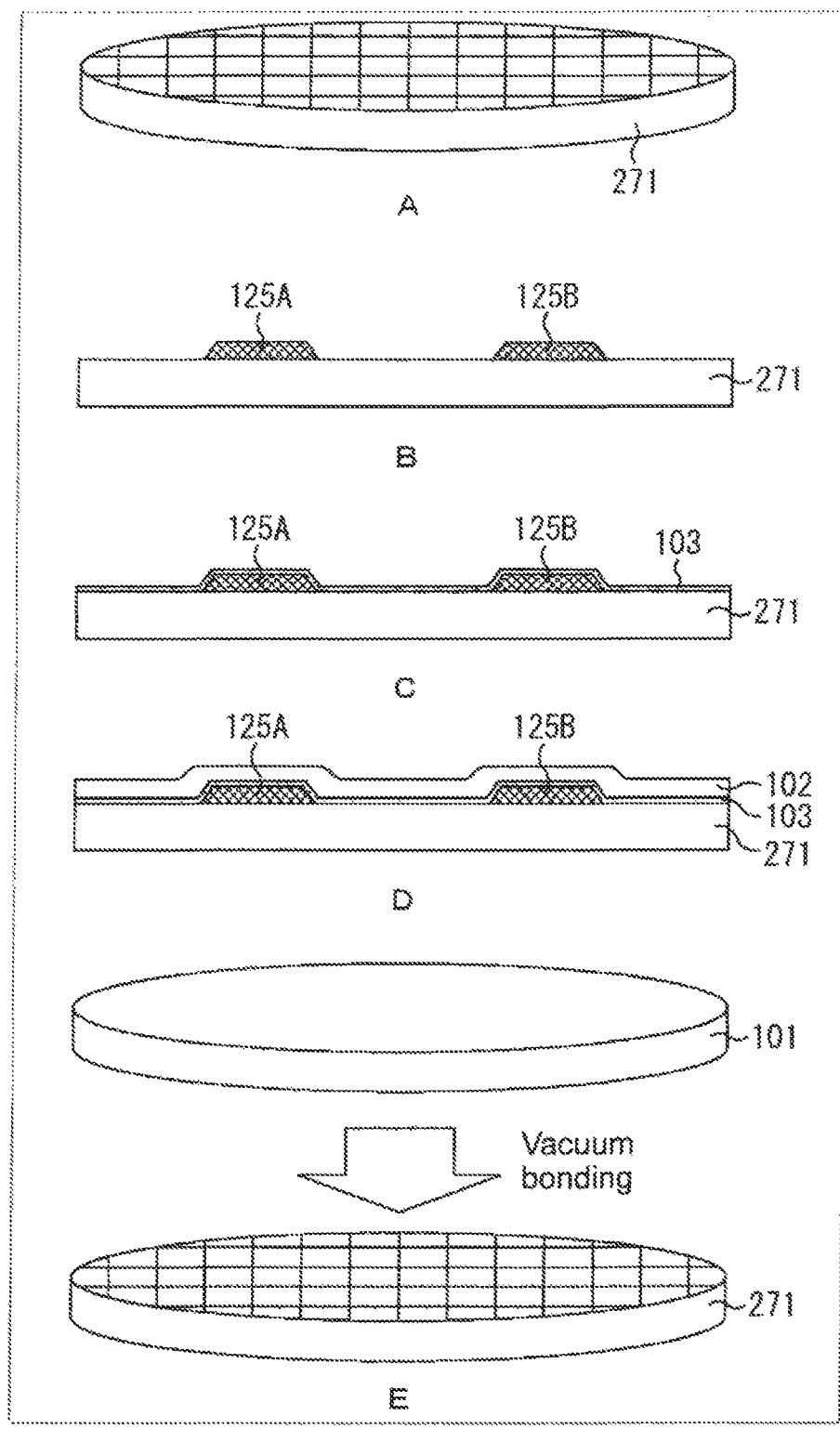
[FIG. 19] Diagrams for explaining another example of the state of production steps.

In Step S267, the rib formation section 261 forms the ribs 125 on as portion of the glass substrate 271 where the organic film (infrared cut filter 102) is not to be formed as shown in FIG. 19A by lithography under control of the control section 201 (e.g., ribs 125A and 125B in FIG. 19B). At this time, the rib formation section 261 causes the side surfaces of the ribs 125 to be tilted by a predetermined angle α such that the side surfaces of the organic film (infrared cut filter 102) are tilted by the predetermined angle α.

In Step S268, the inorganic film formation section 262 forms the inorganic film (moisture resistant film 103) on the glass substrate 271 on which the ribs 125 are formed in a thickness with which sufficient moisture resistance can be obtained so as to seal the organic film by the method of CVD, vapor deposition, or the like under control of the control section 201 (FIG. 19C). The inorganic film (moisture-resistant film 103) may either have a single-layer structure or a multilayer structure as described, in the first embodiment. Moreover, as described above with reference to FIGS. 5 to 7, when controlling the transmission wavelength range of the side surfaces of the organic film (infrared cut filter 102), the thickness or the number of layers of the portion laminated on the side surfaces of the organic film (infrared cut filter 102) is controlled as described above in the first embodiment.

In Step S269, the organic film formation section 263 forms, by the method of spin coat or the like, the organic film (infrared cut filter 102) on the glass substrate 271 on which the ribs 125 and the moisture-resistant film 103 are formed under control of the control section 201. As described above, since the side surfaces of the ribs 125A and 125B are tilted by the predetermined angle α, the side surfaces of the organic film (infrared cut filter 102) formed by being laminated on the ribs 125 are also tilted by the predetermined angle α (FIG. 19D).

Then, as described above, the glass substrate 271 on which the ribs 125, the inorganic film (moisture resistant film 103), and the organic film (infrared cut filter 102) are formed is bonded with the image pickup device 101 formed by the processing of Steps S261 to S266 (FIG. 19E).

Figure 20:
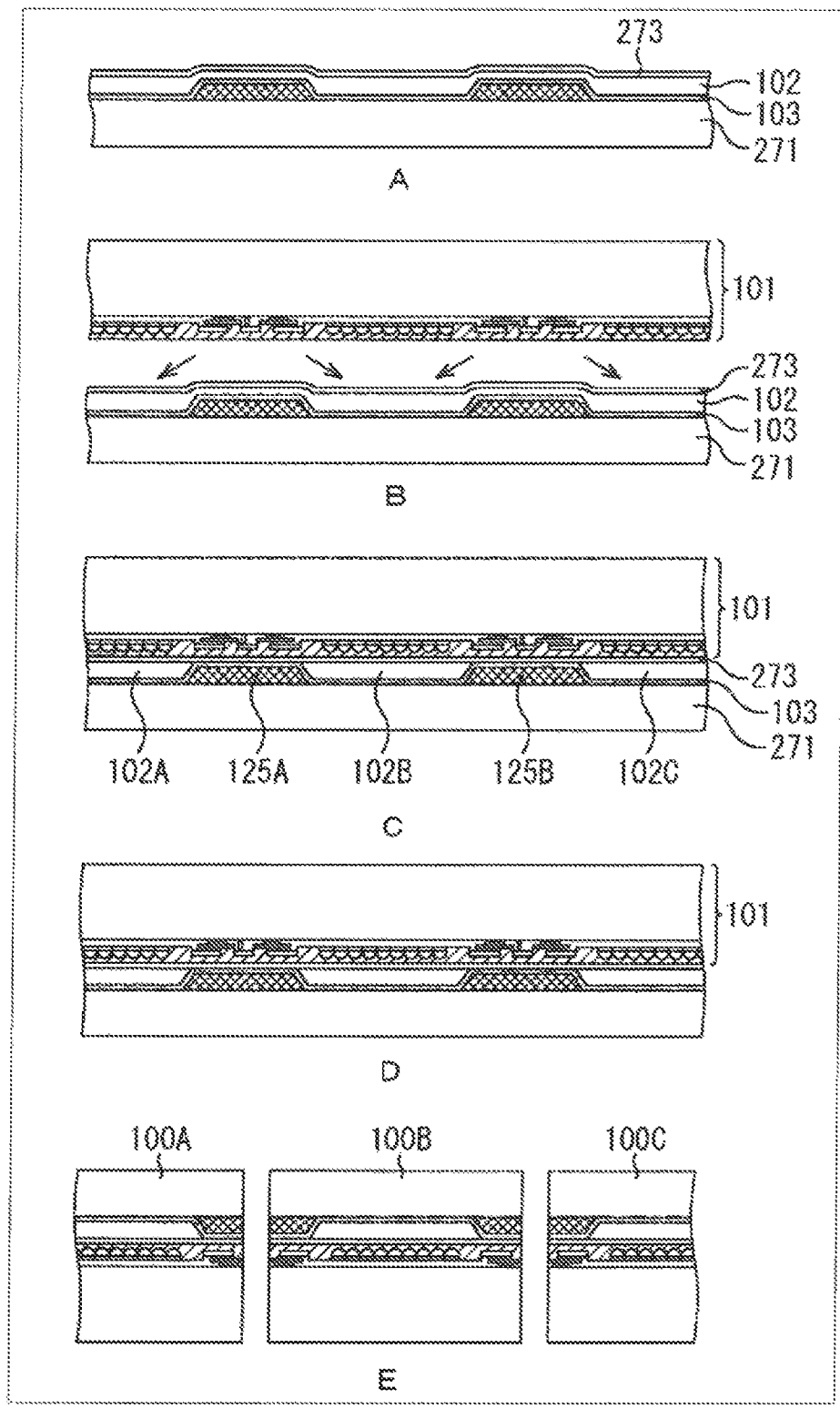
[FIG. 20] Diagrams for explaining another example of the state of production steps subsequent to FIG. 19.

Therefore, when the organic film is cured, the adhesive application section 264 applies an adhesive 273 onto the surface of the organic film (infrared cut filter 102) (upper side of FIG. 19D) under control of the control section 201 in Step S270 (FIG. 20A).

In Step S271, the bonding section 265 positions and bonds the surface of the Mass substrate 271 onto which the adhesive has been applied and the light-incident surface of the image pickup device 101 under control of the control section 201 (FIGS. 20B and 20C).

After the adhesive is cured and the glass substrate 271 and the image pickup device 101 are integrated (FIG. 201D), the wiring formation section 266 forms terminals and through holes or polishes the hack surface of the image pickup device 101 under control of the control section 201 in Step S272.

In Step S273, the dicing section 267 dices the structure produced as described above into individual organic-film-attached image pickup devices (organic-film-attached image pickup devices 100A to 100C) under control of the control section 201 (FIG. 20E).

Upon ending the processing of Step S273, the individual organic-film-attached image pickup devices are supplied to an external apparatus of the production apparatus 200, and the production processing is ended.

By executing the production processing as described above, the production apparatus 200 can generate the organic-film-attached image pickup device 100 (FIG. 3) to which the present technique is applied. In other words, by performing the production as described above, the layers of the organic film can be positively sealed by the inorganic film, and protection performance of the organic film can be improved.

It should be noted that also when bonding the glass substrate and the image pickup device, the inorganic film laminated on the light-incident surface or peripheral section of the organic film and the inorganic film laminated on the side surfaces of the organic film may either be formed in the same step or different steps.

Moreover, it is possible to remove only the glass substrate 271 after bonding the glass substrate 271 to the image pickup device 101 as described above. With such a structure, the height of the organic-film-attached image pickup device 100 can be lowered.

<3. Third Embodiment>
<Image Pickup Apparatus>

The organic-film-attached image pickup device 100 (image sensor) produced by applying the present technique can be applied to devices such as an image pickup apparatus. In other words, the present technique can be implemented not only as the image pickup device but also as a device that uses the image pickup device (e.g., image pickup apparatus).

Figure 21:
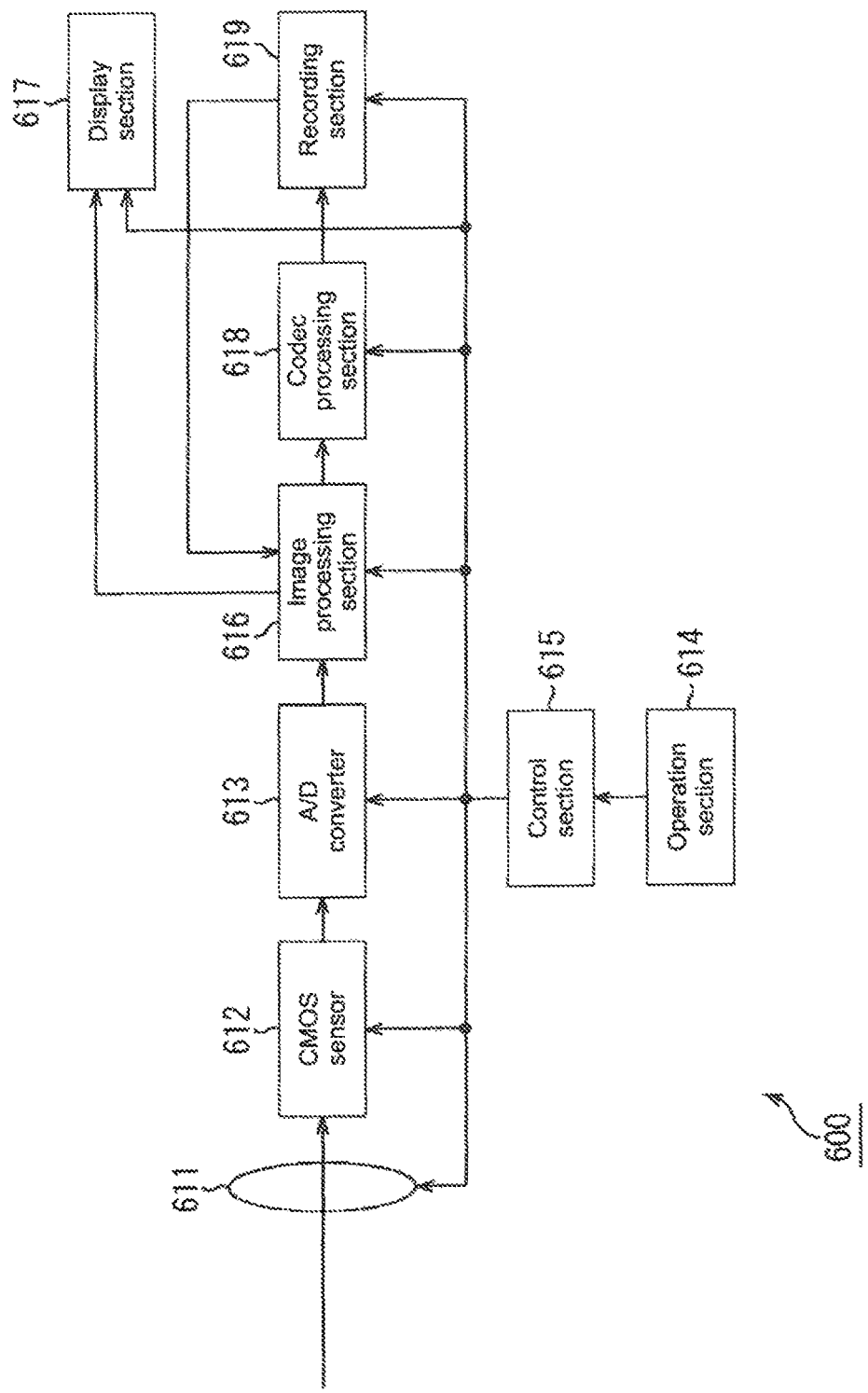
[FIG. 21] A block diagram showing a main structural example of an image pickup apparatus.

FIG. 21 is a block diagram showing a main structural example of the image pickup apparatus. The image pickup apparatus 600 shown in FIG. 21 is an apparatus that picks up an image of an object and outputs the image of the object as electrical signals.

As shown in FIG. 21, the image pickup apparatus 600 includes an optical section 611, a CMOS sensor 612, an A/D converter 613, an operation section 614, a control section 615, an image processing section 616, a display section 617, a codec processing section 618, and a recording section 619.

The optical section 611 is constituted of a lens that adjusts a focal point with respect to the object and collects light from the focused position, an aperture that adjusts an exposure, a shutter that controls an image pickup timing, and the like. The optical section 611 transmits light from the object (incident light) and supplies the light to the CMOS sensor 612.

The CMOS sensor 612 photoelectrically converts the incident light and supplies a signal for each pixel (pixel signal) to the A/D converter 613.

The A/D converter 613 converts the pixel signals supplied from the CMOS sensor 612 at predetermined timings into digital data (image data) and successively supplies the data to the image processing section 616 at predetermined timings.

The operation section 614 is constituted of, for example, a jog dial (registered trademark), keys, buttons, and a touch panel, receives operation inputs from a user, and supplies signals corresponding to the operation inputs to the control section 615.

The control section 615 controls drive of the optical section 611, the CMOS sensor 612, the A/D converter 613, the image processing section 616, the display section 617, the codec processing section 618, and the recording section 619 based on the signals corresponding to the operation inputs of the user input from the operation section 614 and causes the respective sections to carry out processing related to the image pickup.

The image processing section 616 carries out, on the image data supplied from the A/D converter 613, various types of image processing such as mixed color correction, black level correction, white balance adjustment, demosaic processing, matrix processing, gamma processing, and YC conversion. The image processing section 616 supplies the image data subjected to the image processing to the display section 617 and the codec processing section 618.

The display section 617 is structured as a liquid crystal display, for example, and displays an image of the object based on the image data supplied from the image processing section 616.

The codec processing section 618 carries out encoding processing of a predetermined system on the image data supplied from the image processing section 616 and supplies the obtained encoded data to the recording section 619.

The recording section 619 records the encoded data from the codec processing section 618. The encoded data recorded in the recording section 619 is read out and decoded by the image processing section 616 as necessary. The image data obtained by the decoding processing is supplied to the display section 617 so that a corresponding image is displayed.

The present technique described above is applied to the CMOS sensor 612 of the image pickup apparatus 600 as described above. In other words, the organic-film-attached image pickup device 100 to which the present technique is applied is used as the CMOS sensor 612. Therefore, the CMOS sensor 612 includes a photoelectric conversion device that photoelectrically converts incident light that has entered from outside, an organic film that is formed by being laminated on a light-incident surface side of the photoelectric conversion device, and an inorganic film that is formed by being laminated on a light-incident surface Find side surfaces of the organic film and seals the organic film, the side surfaces of the organic film being tilted by an angle at which a thickness of the inorganic film that is formed by being laminated on the side surfaces becomes a predetermined thickness. Therefore, the CMOS sensor 612 can improve protection performance of the organic film and also improve reliability. With the reliability of the image pickup apparatus 600 being improved, an image of higher image quality can be Obtained by the image pickup apparatus 600 picking up an image of an object (lowering of image quality of pickup image can be suppressed).

It should be noted that the image pickup apparatus to which the present technique is applied is not limited to the structure described above, and other structures may be used instead. For example, not only a digital still camera and a video camera but also an information processing apparatus including an image pickup function, such as a cellular phone, a smartphone, a tablet device, and a personal computer may be used. Moreover, a cameral module that is mounted on other information processing apparatuses to be used (or mounted as built-in device) may also be used.

The series of processing described above may be executed either by hardware or software. When the series of processing described above is executed by software, a program constituting the software is installed from a network or a recording medium.

The recording medium is constituted of the removable medium 221 on which a program is recorded, that is different from the apparatus body and is distributed for delivering the program to a user, as shown in FIGS. 11, 14, and 17, for example. The removable medium 221 includes a magnetic disk (including flexible disk) and an optical disc (including CD-ROM and DVD). Further, a magneto-optical disc (including MD (Mini Disc)), a semiconductor memory, and the like are also included. Furthermore, it is also possible for the recording medium described above to be constituted of not only the removable medium 221 as described above but also a ROM in which a program is recorded, a hard disk included in the storage section 213, and the like that are delivered to users while being built-in in the apparatus body in advance.

It should be noted that the program executed by the computer may be a program that carries out the processing in time series in the order described in the specification or a program that carries out the processing in parallel or at necessary timings when invoked or the like.

Moreover, in the specification, the steps describing the program recorded onto a recording medium include not only processing that are carried out in time series in the stated order but also processing that are executed in parallel or individually and do not always need to be processed in time series.

Further, the structure described as a single apparatus (or processing section) in the descriptions above may be divided and structured as a plurality of apparatuses (or processing sections). Conversely, the structure described as the plurality of apparatuses (or processing sections) may be integrally structured as a single apparatus (or processing section). Furthermore, structures other than that described above may of course be added to the structure of each apparatus (or each processing section). In addition, as long as the structures and operations as the entire system are substantially the same, a part of a structure of a certain apparatus (or processing section) may be incorporated into the structure of another apparatus (or another processing section).

Heretofore, the favorable embodiments of the present disclosure have been specifically described with reference to the attached drawings. However, the technical range of the present disclosure is not limited to the examples above. It is apparent that those having common knowledge in the technical field to which the present disclosure pertains are capable of attaining various modified examples and correction examples within the range of the technical idea described in the scope of claims, and it goes without saying that those are also regarded as pertaining to the technical range of the present disclosure.

For example, the present technique may take a cloud computing structure that assigns one function to a plurality of apparatuses via a network for them to process in cooperation with one another.

Moreover, the steps described in the flowchart described above can be shared and executed by the plurality of apparatuses in addition to executing them by a single apparatus.

Further, when a plurality of processing is included in a single step, the plurality of processing included in that single step may be shared and executed by the plurality of apparatuses in addition to executing them by a single apparatus.

Heretofore, the image pickup device has been exemplified in describing the present technique. However, the present technique is not limited to the image pickup device and is also applicable to any semiconductor device.

It should be noted that the present technique may also take the following structures.
(1) An image pickup device, including:
   a photoelectric conversion device that photoelectrically converts incident light that has entered from outside;
   an organic film that is formed by being laminated on a light-incident surface side of the photoelectric conversion device; and
   an inorganic film that is formed by being laminated on a light-incident surface and side surfaces of the organic film and seals the organic film,
   the side surfaces of the organic film being tilted by an angle at which a thickness of the inorganic film that is formed by being laminated on the side surfaces becomes a predetermined thickness.
(2) The image pickup device according to any one of (1) and (3) to (13), in which:
   the inorganic film is a protection film that suppresses permeation of moisture or oxygen, or both of them; and
   the side surfaces of the organic film are tilted by an angle at which the thickness of the inorganic film that is formed by being laminated on the side surfaces becomes a thickness with which a sufficient effect as the protection film can be obtained.
(3) The image pickup device according to any one of (1), (2), and (4) to (13),
   in which the inorganic film is farther formed by being laminated on a layer that is in contact with a surface of the organic film opposite to the light-incident surface or a layer that is formed more on the opposite side of the light-incident surface than the layer that is in contact with the surface of the organic film opposite to the light-incident surface, in a peripheral section of the organic film.
(4) The image pickup device according to any one of (1) to (3) and (5) to (13), further including
   ribs that are formed by being laminated on the light-incident surface of the inorganic film.
(5) The image pickup device according to any one of (1) to (4) and (6) to (13), further including
   a transparent layer that is formed of glass or resin and formed by being laminated on the light-incident surface of the inorganic film and the ribs.
(6) The image pickup device according to any one of (1) to (5) and (7) to (13),
   in which the inorganic film is further formed by being laminated on a surface of the organic film opposite to the light-incident surface.
(7) The image pickup device according to any one of (1) to (6) and (8) to (13), in which:
   the inorganic film is formed such that a plurality of layers having different refractive indexes are structured; and
   the side surfaces of the organic film are tilted by an angle at which the thickness of the inorganic film that is formed by being laminated on the side surfaces becomes a thickness that transmits a predetermined wavelength range of the incident light or a thickness that suppresses transmission of the predetermined wavelength range of the incident light.
(8) The image pickup device according to any one of (1) to (7) and (9) to (13),
   in which transmission wavelength characteristics of the inorganic film that is formed by being laminated on the light-incident surface of the organic film differ from transmission wavelength characteristics of the inorganic film that is formed by being laminated on the side surfaces of the organic film.
(9) The image pickup device according to any one of (1) to and (10) to (13), in which:
   the inorganic film that is formed by being laminated on the light-incident surface of the organic film transmits a wavelength range that is photoelectrically converted by the photoelectric conversion device; and
   the inorganic film that is formed by being laminated on the side surfaces of the organic film suppresses transmission of the wavelength range that is photoelectrically converted by the photoelectric conversion device.
(10) The image pickup device according to any one of (1) to (9) and (11) to (13), in which:
   the inorganic film that is formed by being laminated on the light-incident surface of the organic film transmits a wavelength range of visible light; and
   the inorganic film that is formed by being laminated on the side surfaces of the organic film suppresses transmission of the wavelength range of visible light.
(11) The image pickup device according to any one of (1) to (10), (12), and (13),
   in which the thickness of the inorganic film that is formed by being laminated on the light-incident surface of the organic film and the thickness of the inorganic film that is formed by being laminated on the side surfaces of the organic film differ.
(12) The image pickup device according to any one of (1) to (11) and (13),
   in which a ratio of the thickness oldie inorganic film that is formed by being laminated on the side surfaces of the organic film to the thickness of the inorganic film that is formed by being laminated on the light-incident surface of the organic film is equal to or smaller than a ratio of a lower limit of the wavelength range transmitted through the inorganic film that is formed by being laminated on the light-incident surface of the organic film to an upper limit of the wavelength range.
(13) The image pickup device according to any one of (1) to (12),
   in which the number of layers of the inorganic film that is formed by being laminated on the light-incident surface of the organic film differs from the number of layers of the inorganic film that is formed by being laminated on the side surfaces of the organic film.
(14) An image pickup apparatus, including:
   image pickup device including
      a photoelectric conversion device that photoelectrically converts incident light that has entered from outside,
      an organic film that is formed by being laminated on a light-incident surface side of the photoelectric conversion device, and
      an inorganic film that is formed by being laminated on a light-incident surface and side surfaces of the organic film and seals the organic film,
      the side surfaces of the organic film being tilted by an angle at which a thickness of the inorganic film that is formed by being laminated on the side surfaces becomes a predetermined thickness; and
   an image processing section that performs image processing on pickup image data obtained by the image pickup device.

(15) A production apparatus that produces an image pickup device, including:
a photoelectric conversion device formation section that forms a photoelectric conversion device that photoelectrically converts incident light that enters from outside;
an organic film formation section that forms an organic film by laminating it on a light-incident surface side of the photoelectric conversion device;
an organic film processing section that processes the organic film formed by the organic film formation section while imparting, to side surfaces of the organic film, a tilt by an angle at which a thickness of the inorganic film that is formed by being laminated on the side surfaces becomes a predetermined thickness; and
an inorganic film formation section that forms an inorganic film that seals the organic film by laminating it on a light-incident surface and side surfaces of the organic film.
(16) The production apparatus according to (15) or (17),
in which the inorganic film formation section forms the inorganic film laminated on the light-incident surface of the organic film and the inorganic film laminated on the side surfaces of the organic film in the same step.
(17) The production apparatus according to (15) or (16),
in which the inorganic film formation section forms the inorganic film laminated on the light-incident surface of the organic film and the inorganic film laminated on the side surfaces of the organic film in different steps.
(18) A production method for a production apparatus that produces an image pickup device, including:
forming a photoelectric conversion device that photoelectrically converts incident light that enters from outside;
forming an organic film by laminating it on a light-incident surface side of the photoelectric conversion device;
processing the formed organic film while imparting, to side surfaces of the organic film, a tilt by an angle at which a thickness of the inorganic film that is formed by being laminated on the side surfaces becomes a predetermined thickness; and
forming an inorganic film that seals the organic film by laminating it on a light-incident surface and side surfaces of the organic film.
(19) A production apparatus that produces an image pickup device, including:
an image pickup device formation section that forms an image pickup device that photoelectrically converts incident light that enters from outside;
a rib formation section that forms ribs on a transparent layer formed of glass or resin;
an inorganic film formation section that forms an inorganic film by laminating it on a surface of the transparent layer on which the ribs are formed by the rib formation section;
an organic film formation section that forms an organic film by laminating it on the inorganic film formed by being laminated on the transparent layer by the inorganic film formation section; and
a bonding section that bonds the organic film formed by being laminated on the transparent layer by the organic film formation section and a fight-incident surface of the image pickup device formed by the image pickup device formation section.
(20) A production method for a production apparatus that produces an image pickup device, including:
forming an image pickup device that photoelectrically converts incident light that enters from outside;
forming ribs on a transparent layer formed of glass or resin;
forming an inorganic film by laminating it on a surface of the transparent layer on which the ribs are formed;
forming an organic film by laminating it on the inorganic film formed by being laminated on the transparent layer; and
bonding the organic film formed by being laminated on the transparent layer and a light-incident surface of the formed image pickup device.

DESCRIPTION OF REFERENCE NUMERALS 100 organic-film-attached image pickup device
101 image pickup device
102 infrared cut filter
103 moisture-resistant film
111 flattening film
124 transparent layer
125 ribs
142 electrode
143 moisture-resistant film
200 production apparatus
201 control section
202 production section
231 photodiode formation section
232 wiring layer formation section
233 light shield film formation section
234 flattening film formation section
235 filter formation section
236 collective lens formation section
241 organic film formation section
242 organic film processing section
243 inorganic film formation section
244 dicing section
251 upper-surface inorganic film formation section
252 side-surface inorganic film formation section
261 rib formation section
262 inorganic film formation section
263 organic film formation section
264 adhesive application section
265 bonding section
266 wiring formation section
267 dicing section
600 image pickup apparatus
612 CMOS sensor

The invention claimed is:
1. An image pickup device, comprising:
a photoelectric conversion device configured to generate an electrical signal based on incident light;
an organic film having a first surface, a second surface opposite to the first surface, a first side surface and a second side surface,
wherein the second surface is on a first light-incident surface of the photoelectric conversion device; and
an inorganic film on the first surface, the first side surface, and the second side surface of the organic film, wherein
the inorganic film comprises a plurality of transparent layers and at least one layer of a transparent metal oxide,
at least one of the first side surface or the second side surface of the organic film is tilted with respect to the second surface at an angle,
a first thickness of the inorganic film on the first surface is greater than a second thickness of the inorganic film on the first side surface and the second side surface, and
the inorganic film on the first side surface and the second side surface is laminated in order to suppress transmission of light of visible wavelength from the first side surface and the second side surface.

2. The image pickup device according to claim 1, wherein the inorganic film is a protection film configured to:
suppress permeation of at least one of moisture or oxygen, wherein an amount of suppression of the permeation is based on the first thickness of the inorganic film.

3. The image pickup device according to claim 2, further comprising a first layer on a second light-incident surface of the inorganic film.

4. The image pickup device according to claim 3, further comprising a plurality of ribs between the inorganic film and the first layer.

5. The image pickup device according to claim 3, wherein the first layer is a transparent layer of one of glass or resin.

6. The image pickup device according to claim 1, wherein the inorganic film further comprises a plurality of layers having different refractive indexes,
the plurality of layers of the inorganic film comprises the at least one layer of the transparent metal oxide, and
a first wavelength range of transmitted light from the inorganic film is based on the first thickness of the inorganic film.

7. The image pickup device according to claim 6, wherein first transmission wavelength characteristics of the inorganic film on the first surface is different from a second transmission wavelength characteristics of the inorganic film on the at least one of the first side surface or the second side surface of the organic film.

8. The image pickup device according to claim 6, wherein:
a first portion of the inorganic film on the first surface is configured to transmit a second wavelength range, and
a second portion of the inorganic film on the at least one of the first side surface or the second side surface of the organic film is configured to suppress the transmission of the second wavelength range.

9. The image pickup device according to claim 6, wherein:
a first portion of the inorganic film on the first surface is configured to transmit a second wavelength range of visible light, and
a second portion of the inorganic film on the at least one of the first side surface or the second side surface of the organic film is configured to suppress the transmission of the second wavelength range of the visible light.

10. The image pickup device according to claim 8, wherein a first ratio of the first thickness to the second thickness is one of equal to or smaller than a second ratio of a lower limit of the second wavelength range to an upper limit of the second wavelength range.

11. The image pickup device according to claim 6, wherein a first count of first layers of the plurality of layers of the inorganic film on the first surface of the organic film is different from a second count of second layers of the plurality of layers of the inorganic film on the at least one of the first side surface or the second side surface of the organic film.

12. An image pickup apparatus, comprising:
an image sensor configured to obtain pickup image data, the image sensor including:
a photoelectric conversion device configured to generate an electrical signal based on incident light;
an organic film having a first surface, a second surface opposite to the first surface, a first side surface, and a second side surface,
wherein the second surface is on a first light-incident surface of the photoelectric conversion device; and
an inorganic film on the first surface, the first side surface, and the second side surface of the organic film, wherein
the inorganic film comprises a plurality of transparent layers and at least one layer of a transparent metal oxide,
at least one of the first side surface or the second side surface of the organic film is tilted with respect to the second surface at an angle,
a first thickness of the inorganic film on the first surface is greater than a second thickness of the inorganic film on the first side surface and the second side surface, and
the inorganic film on the first side surface and the second side surface is laminated in order to suppress transmission of light of visible wavelength from the first side surface and the second side surface; and
at least one processor configured to process the pickup image data.

13. A production apparatus, comprising:
a photoelectric conversion device formation section configured to produce a photoelectric conversion device, wherein the photoelectric conversion device is configured to generate an electrical signal based on incident light;
an organic film formation section configured to form, on the photoelectric conversion device, an organic film having a first surface, a second surface opposite to the first surface, a first side surface and a second side surface,
wherein the second surface is on a first light-incident surface of the photoelectric conversion device;
an organic film processing section configured to:
process the organic film; and
impart, to at least one of the first side surface or the second side surface of the organic film, a tilt with respect to the second surface of the organic film at an angle; and
an inorganic film formation section configured to form an inorganic film on the first surface, the first side surface, and the second side surface of the organic film, wherein
the inorganic film comprises a plurality of transparent layers and at least one layer of a transparent metal oxide,
a first thickness of the inorganic film on the first surface is greater than a second thickness of the inorganic film on the first side surface and the second side surface, and
the inorganic film on the first side surface and the second side surface is laminated in order to suppress transmission of light of visible wavelength from the first side surface and the second side surface.

14. The production apparatus according to claim 13, wherein the inorganic film formation section is further configured to concurrently form the inorganic film on the first surface of the organic film and on at least one of the first side surface or the second side surface of the organic film.

15. The production apparatus according to claim 13, wherein the inorganic film formation section is further configured to independently form the inorganic film on the first surface of the organic film and on at least one of the first side surface or the second side surface of the organic film.

16. A production method, comprising:
forming a photoelectric conversion device that is configured to generate an electrical signal based on incident light;
forming on the photoelectric conversion device, an organic film having a first surface, a second surface opposite to the first surface, a first side surface and a second side surface,
wherein the second surface is on a first light-incident surface of the photoelectric conversion device;
processing the organic film to impart to at least one of the first side surface or the second side surface of the organic film, a tilt with respect to the second surface of the organic film at an angle; and
forming an inorganic film on the first surface, the first side surface, and the second side surface of the organic film, wherein
the inorganic film comprises a plurality of transparent layers and at least one layer of a transparent metal oxide,
a first thickness of the inorganic film on the first surface is greater than a second thickness of the inorganic film on the first side surface and the second side surface, and
the inorganic film on the first side surface and the second side surface is laminated in order to suppress transmission of light of visible wavelength from the first side surface and the second side surface.

17. A production apparatus, comprising:
an image pickup device formation section configured to produce an image pickup device, wherein the image pickup device is configured to generate an electrical signal based on incident light;
a rib formation section configured to form a plurality of ribs on a transparent layer of one of glass or resin;
an inorganic film formation section configured to form an inorganic film on a first surface of the transparent layer;
an organic film formation section configured to form an organic film on the inorganic film, wherein
the organic film has a first surface, a second surface opposite to the first surface, a first side surface and a second side surface,
at least one side surface of the organic film is tilted with respect to the second surface of the organic film at an angle,
the inorganic film comprises a plurality of transparent layers and at least one layer of a transparent metal oxide,
a first thickness of the inorganic film on the first surface is greater than a second thickness of the inorganic film on the first side surface and the second side surface, and
the inorganic film on the first side surface and the second side surface is laminated in order to suppress transmission of light of visible wavelength from the first side surface and the second side surface; and
a bonding section configured to bond the second surface of the organic film and a first light-incident surface of the image pickup device.

18. A production method, comprising:
in a production apparatus:
forming an image pickup device that is configured to generate an electrical signal based on incident light;
forming a plurality of ribs on a transparent layer of one of glass or resin;
forming an inorganic film on a first surface of the transparent layer;
forming an organic film on the inorganic film, wherein
the organic film has a first surface, a second surface opposite to the first surface, a first side surface and a second side surface,
at least one side surface of the organic film is tilted with respect to the second surface of the organic film at an angle,
the inorganic film is at least one layer of a transparent metal oxide,
a first thickness of the inorganic film on the first surface is greater than a second thickness of the inorganic film on the first side surface and the second side surface, and
the inorganic film on the first side surface and the second side surface is laminated in order to suppress transmission of light of visible wavelength from the first side surface and the second side surface, wherein the inorganic film comprises a plurality of transparent layers; and
bonding the second surface of the organic film and a first light-incident surface of the image pickup device.

* * * * *